United States Patent
Inukai

(10) Patent No.: US 7,230,591 B2
(45) Date of Patent: Jun. 12, 2007

(54) DISPLAY DEVICE AND METHOD OF DRIVING THE SAME

(75) Inventor: Kazutaka Inukai, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1079 days.

(21) Appl. No.: 10/154,214

(22) Filed: May 23, 2002

(65) Prior Publication Data
US 2002/0180671 A1 Dec. 5, 2002

(30) Foreign Application Priority Data
May 30, 2001 (JP) .............................. 2001-163307

(51) Int. Cl.
*G09G 3/30* (2006.01)
(52) U.S. Cl. .......................................... 345/76; 345/36
(58) Field of Classification Search ................. 345/82, 345/76, 77, 78, 79, 80, 205, 206, 36, 42, 345/45, 46, 48, 84, 204; 315/169.3
See application file for complete search history.

(56) References Cited

U.S. PATENT DOCUMENTS

| | | | |
|---|---|---|---|
| 4,523,189 A | 6/1985 | Takahara et al. | 345/781 |
| 4,806,496 A | 2/1989 | Suzuki et al. | 437/4 |
| 4,887,074 A * | 12/1989 | Simon et al. | 345/82 |
| 5,828,181 A * | 10/1998 | Okuda | 315/169.3 |
| 5,955,765 A | 9/1999 | Yamazaki et al. | 257/365 |
| 6,501,227 B1 * | 12/2002 | Koyama | 315/169.3 |
| 6,522,319 B1 | 2/2003 | Yamazaki | 345/103 |
| 6,529,178 B1 * | 3/2003 | Kimura | 345/76 |
| 6,636,191 B2 * | 10/2003 | Cok | 345/82 |
| 6,661,180 B2 * | 12/2003 | Koyama | 315/169.3 |
| 6,661,397 B2 * | 12/2003 | Mikami et al. | 345/76 |
| 6,700,330 B2 | 3/2004 | Koyama | |
| 6,750,833 B2 | 6/2004 | Kasai | 345/76 |
| 6,872,973 B1 | 3/2005 | Koyama et al. | 257/59 |

(Continued)

FOREIGN PATENT DOCUMENTS

CN     1216134     5/1999

(Continued)

OTHER PUBLICATIONS

U.S. Appl. No. 09/692,753, filed Oct. 2000, Jun Koyama et al.*

(Continued)

*Primary Examiner*—Richard Hjerpe
*Assistant Examiner*—Jean Lesperance
(74) *Attorney, Agent, or Firm*—Cook, Alex, McFarron, Manzo, Cummings & Mehler, Ltd.

(57) ABSTRACT

A circuit for driving an organic light emitting element by alternating current in an active matrix organic light emitting display is provided. A circuit of a pixel provided with a switching TFT and a current controlling TFT further is provided with an element that has a rectifying characteristic. The switching TFT charges a capacitor in accordance with a data signal and the current controlling TFT controls light emission of an organic light emitting element in accordance with voltage supplied from the capacitor. Reverse bias is readily applied to the organic light emitting element by applying voltage to the element that has a rectifying characteristic in the forward direction from an alternating current source.

22 Claims, 16 Drawing Sheets

U.S. PATENT DOCUMENTS

| | | |
|---|---|---|
| 6,900,785 B2 | 5/2005 | Kimura |
| 6,909,111 B2 | 6/2005 | Yamagata et al. ............ 257/59 |
| 2002/0042152 A1 | 4/2002 | Yamazaki et al. ............. 438/4 |
| 2002/0047839 A1 | 4/2002 | Kasai ......................... 345/211 |
| 2003/0058210 A1 | 3/2003 | Yamazaki et al. ............ 345/89 |
| 2003/0071771 A1 | 4/2003 | Kimura |
| 2003/0117083 A1 | 6/2003 | Koyama |

FOREIGN PATENT DOCUMENTS

| | | |
|---|---|---|
| CN | 1290041 | 4/2001 |
| EP | 0 704 912 | 4/1996 |
| EP | 0 942 407 A1 | 9/1999 |
| EP | 1 087 366 A2 | 3/2001 |
| EP | 1 094 436 A2 | 4/2001 |
| EP | 1 094 438 | 4/2001 |
| JP | 08-180972 | 7/1996 |
| JP | 2001-142413 | 5/2001 |

OTHER PUBLICATIONS

Pending U.S. Appl. No. 09/692,753 to Koyama et al filed Oct. 19, 2000, including specification, claims, abstract, drawings and PTO filing receipt.

Zou, D. et al, "Improvement of Current-Voltage Characteristics in Organic Light Emitting Diodes by Application of Reversed-Bias Voltage," Japanese Journal of Applied Physics, vol. 37, part 2, No. 11B, pp. L-1406-L1408, Nov. 15, (1998).

Office Action re Chinese Patent Application No. 02122231.2, dated Jul. 28, 2006 (with full English translation).

* cited by examiner

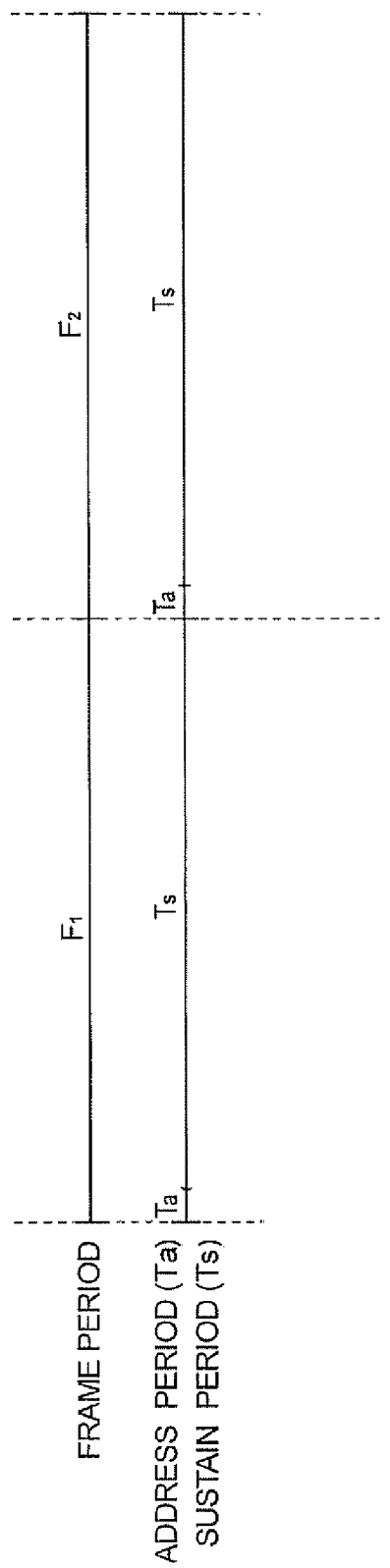

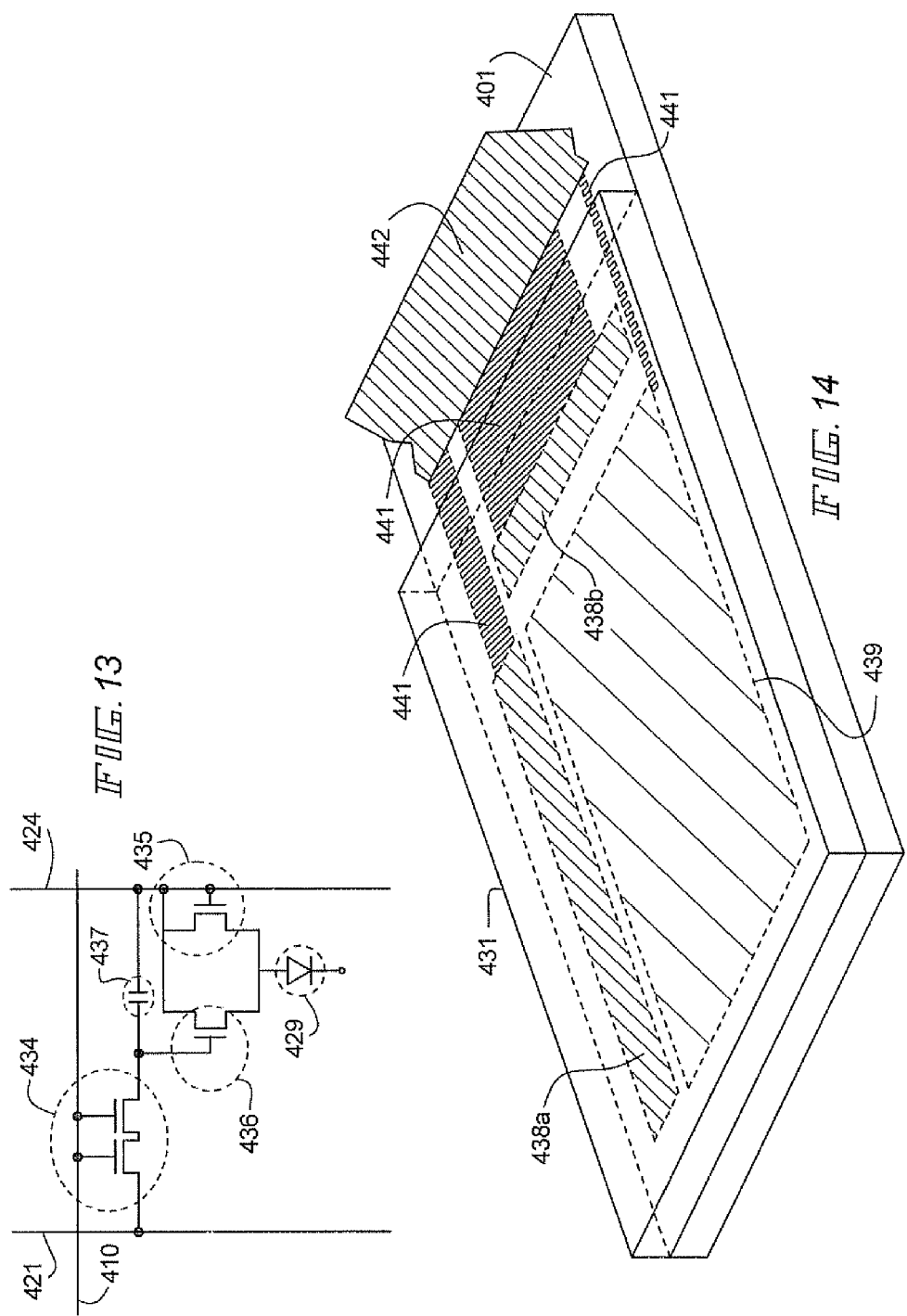

DISPLAY DEVICE AND METHOD OF DRIVING THE SAME

BACKGROUND OF THE INVENTION

1. Field of the Invention

The present invention relates to a display device which has an organic light emitting element and to a method of driving the display device. Specifically, the present invention relates to a display device in which an organic light emitting element is driven with alternating current and a driving method thereof.

2. Description of the Related Art

In recent years, a technique of forming a transistor, for example, a TFT (thin film transistor) on a substrate has been advanced greatly to promote development of active matrix display devices. Active matrix display devices are free from the problem of cross talk in passive matrix display devices and therefore are capable of displaying images with higher definition and contrast compared to passive matrix display devices.

TFTs using polysilicon for their active layers have higher field effect mobility than conventional TFTs that use amorphous silicon and therefore can operate at high speed. This makes it possible to perform control the luminance of pixels, which has conventionally been done by an external driving circuit to the substrate, by a driving circuit formed on the same substrate on which the pixels are formed. Thus formed active matrix display devices can have various circuits and elements on the same substrate, which helps to reduce the display devices in size.

A display device using organic light emitting elements (hereinafter referred to as organic light emitting displays) has also been developed actively in recent years. An organic light emitting elements is self-luminous and does not need a light source such as back light, unlike liquid crystal display devices. Therefore, organic light emitting elements is deemed as promising means for reducing weight and thickness of display devices, and are expected to be used in cellular phones, personal portable information terminals (personal digital assistant: PDA), and the like.

An organic light emitting element has a diode structure with an organic compound layer sandwiched between two electrodes and emits light by re-combining electrons injected from one of the electrodes with holes injected from the other electrode in an organic compound layer. The organic light emitting element provides electro-luminescence (EL), for example, fluorescence or phosphorescence. Because of the diode structure, the organic light emitting elements is also called organic light emitting diodes (OLEDs).

An organic light emitting element is often composed of an anode, a hole transporting layer, a light emitting layer, an electron transporting layer, and a cathode. This structure is so high in light emission efficiency that almost all organic light emitting elements that are under development at present employ this structure. One or both of hole injection layer and electron injection layer are omitted in some cases. However, a light emitting layer is an indispensable component to an organic light emitting element since an organic light emitting element emits light through recombination of carriers when current flows into the light emitting layer.

An organic compound layer is a collective name for carrier (electrons and holes) transporting layers, a light emitting layer that is formed of a material with high quantum yield, and other layers. The light emitting layer, hole injecting layer, and electron injecting layer mentioned above are included in the organic compound layer.

An organic light emitting element has a high rectifying characteristic and emits light through recombination of carriers when the electric potential of its anode exceeds the electric potential of the cathode to cause current to flow in the organic compound layer. On the other hand, when the electric potential of the anode is lower than the electric potential of the cathode, current does not flow in the organic compound layer and no light is emitted. In the diode structure as an organic light emitting element, voltage applied in a direction, in which current readily flows is called forward bias whereas voltage applied in a direction in which current finds it difficult to flow, is called reverse bias.

FIG. 19 shows an equivalent circuit of a pixel portion in a conventional active matrix organic light emitting display.

Gate signal lines ($G_1$ to $G_n$) are connected to gate electrodes of switching TFTs of pixels. Each switching TFT is denoted by 901 and each pixel is denoted by 900. Each switching TFT has a source and a drain, one of which is connected to one of source signal lines ($S_1$ to $S_n$) for inputting data signals and the other of which is connected to a gate electrode of a current controlling TFT 902 and to one of electrodes of a capacitor 903. Each pixel has one current controlling TFT 902 and one capacitor 903. The other electrode, namely, one of electrodes of a capacitor that is not connected to a switching TFT is connected to one of power supply lines ($V_1$ to $V_m$).

Each current controlling TFT has a source and a drain, one of which is connected to one of the power supply lines and the other of which is connected to a pixel electrode of an organic light emitting element 905. Each pixel has one organic light emitting element 905. An opposite electrode of an organic light emitting element faces the pixel electrode of the organic light emitting element and sets the reference electric potential for the pixel electrode.

For conveniences' sake of explanation, an opposite electrode is connected to an opposite power supply 906. The difference in electric potential between the power supply lines and the opposite power supply is set to a level at which the voltage is large enough to cause an organic light emitting element to emit light.

Each organic light emitting element 905 has an anode and a cathode, one of which serves as a pixel electrode and the other of which serves as an opposite electrode. An anode of an organic light emitting element serves as a pixel electrode and a cathode of the organic light emitting element serves as an opposite electrode when the anode of the organic light emitting element is connected to a source or drain of a current controlling TFT. On the other hand, a cathode of an organic light emitting element serves as a pixel electrode and an anode of the organic light emitting element serves as an opposite electrode when the cathode of the organic light emitting element is connected to a source or drain of a current controlling TFT.

The luminance of light emitted from an organic light emitting element is determined as follows. A selection signal is inputted from the gate signal line to the gate electrode of the switching TFT 901 to turn the switching TFT ON (conductive). Then, a data signal inputted to the source signal line is inputted to the gate electrode of the current controlling TFT 902 through the switching TFT. The electric potential of the gate electrode of the current controlling TFT is held by the capacitor 903. Accordingly, the difference in electric potential between the gate electrode of the current controlling TFT 902 and the power supply line (one of $V_1$ to $V_m$), namely, the gate voltage of the current controlling TFT is kept constant until a next data signal is inputted to the pixel.

When the current controlling TFT is turned ON, current flows from a semiconductor layer of the current controlling TFT to the organic light emitting element that is connected in series to the semiconductor layer of the current controlling TFT. The intensity of light emitted from the organic light emitting element is determined in accordance with the amount of current that flows into the organic light emitting element. The amount of current flowing into a current controlling TFT is controlled by a data signal inputted to each pixel and therefore the luminance of light emitted from each pixel can be controlled by the electric potential of data signal.

In general, 'driving an organic light emitting element with direct current' means maintaining light emission by keeping the electric potential of an anode higher than the electric potential of a cathode to cause direct current to flow. In this case, the anode is either an opposite electrode or a pixel electrode and the cathode is the other of the two electrodes.

However, when an organic light emitting element is driven with direct current, the luminance of light emitted from the organic light emitting element is lowered with time. Direct current driving causes degradation of luminance with age supposedly because ionic impurities accumulate in the interface of the organic compound layer and molecules constituting the organic compound layer are polarized in a single direction along the electric field to create inside the organic compound layer an electric field reversely oriented with respect to an electric field applied by the pixel electrode or the opposite electrode of the organic light emitting element.

In particular, the luminance of light emitted from an organic light emitting element is markedly lowered with time if the organic light emitting element is driven while the voltage applied between the cathode and anode of the organic light emitting element is kept constant (hereinafter referred to as constant voltage method). In the constant voltage method, since the level of the voltage applied to the cathode and the anode is always constant, the effective voltage applied to the organic compound layer is reduced as the intensity of the electric field created in the organic compound layer increases to lower the luminance of light emitted from the organic light emitting element.

In order to prevent this degradation of luminance, the organic light emitting element has to be driven with alternating current. 'Driving an organic light emitting element with alternating current' means alternately applying voltages with different polarities to the organic light emitting element. In other words, reverse bias is applied in addition to forward bias that is necessary for light emission. Forward bias and reverse bias may not always have the same magnitude or application time. When a minute reverse bias is applied, it still is regarded as alternating current driving.

However, in the conventional circuit described above, connecting an alternating current source to the opposite electrode of the organic light emitting element and to the power supply lines is sometimes not enough to apply a sufficient reverse bias to the organic light emitting element. This will be explained below.

The circuit shown in FIG. 19 is a closed circuit in which the source or drain of the current controlling TFT 902 is connected serially to the organic light emitting element 905 between the opposite power supply 906 and the power supply line (one of $V_1$ to $V_m$). The operation of this closed circuit in applying voltages to the organic light emitting element with alternating current is described. To simplify the explanation, the current controlling TFT in the description below is a p-channel TFT. The p-channel TFT is turned ON when the electric potential of the gate is lower than the electric potential of the source, namely, the electric potential of the power supply line and the difference thereof exceeds the threshold.

Therefore, in order to apply forward bias to the organic light emitting element, the electric potential of the opposite electrode of the organic light emitting element 905 is set to the Lo level whereas the electric potential of the power supply line is set to the Hi level, and the electric potential of the gate of the current controlling TFT is lower than the electric potential of the power supply line (the source of the current controlling TFT) to exceeding the threshold. The current controlling TFT is turned ON, namely, conductive, and current flows into the organic light emitting element 905 to cause the organic light emitting element to emit light.

When the current flowing into the organic light emitting element is to be stopped without changing the electric potentials of the power supply line and opposite electrode, the electric potential of the gate of the current controlling TFT is set higher than the electric potential of the source thereof to turn the current controlling TFT OFF.

Suppose that now the current controlling TFT is ON and the electric potentials of the power supply line and opposite electrode are inverted to apply reverse bias to the organic light emitting element. That is, the electric potential of the opposite electrode of the organic light emitting element 905 is set to the Hi level whereas the electric potential of the power supply line is set to the Lo level. At this point, the series circuit consisting of the opposite electrode, the organic light emitting element, the current controlling TFT, and the power supply line is equivalent to a source follower circuit. Accordingly, a great reduction in voltage occurs here since the gate electric potential of the current controlling TFT is low, and therefore only insufficient reverse bias is applied to the organic light emitting element.

As has been described, outputting an alternating current waveform between the opposite power supply 906 and the power supply line is sometimes not enough to apply a sufficient reverse bias to the organic light emitting element. The same applies to the case where the current controlling TFT is an n-channel TFT in order that current flows from an anode to a cathode in an organic light emitting element when a pixel electrode of the organic light emitting element serves as the cathode and a opposite electrode thereof serves as the anode.

It is thus difficult to drive an organic light emitting element with alternating current in the conventional circuit structure described above, and the problem of great reduction in luminance of an organic light emitting element with time due to application of direct current voltage is yet to be solved.

SUMMARY OF THE INVENTION

The present invention has been made in view of the above and an object of the present invention is therefore to provide a display device and driving method thereof, in order that an organic light emitting element is driven by applying alternating current voltage to prevent reduction in luminance of the organic light emitting element and the quality of displayed images are improved.

An organic light emitting element can be driven with alternating current by adding an element which has a rectifying characteristic (hereinafter referred to as rectifying element) to the conventional circuit.

In a circuit where a rectifying element and a semiconductor layer of a current controlling TFT are connected in parallel to each other, when one of the rectifying element and the semiconductor layer of the current controlling TFT has a high resistance and the other have a low resistance at a voltage level set in accordance with the low resistance, voltage in accordance with the low resistance can be applied to the organic light emitting element.

A rectifying element refers to an element which has a rectifying characteristic in which a characteristic curve indicating the relation between applied voltage and current flowing into the rectifying element is asymmetric with respect to the origin. Current flows when voltage with one polarity is applied to the rectifying element whereas almost no current flows when voltage with the other polarity is applied to the rectifying element. The direction in which current readily flows is called forward direction and a direction in which current finds it difficult to flow is called reverse direction.

An example of a circuit to which the present invention is applied is described with reference to FIG. 17. FIG. 17 shows an equivalent circuit of a pixel 100. According to the present invention, a rectifying element 109 is added to a conventional closed circuit in which a semiconductor layer of a current controlling TFT 102 and an organic light emitting element 105 are connected in series to an alternating current source 106, The rectifying element 109 and the semiconductor layer of the current controlling TFT 102 are in parallel to each other. For conveniences' sake of explanation, the conductivity type of the current controlling TFT is the p-type.

In FIG. 17, the alternating current source 106 is connected to a power supply line ($V_i$) by a dotted line and another dotted line is used to connect the alternating current source 106 with the organic light emitting element 105. This indicates that the alternating current source is placed outside a pixel portion in which the pixel 100 and similarly structured pixels are arranged to form a matrix and that the alternating current source supplies an alternating current waveform to the pixel 100 through a connection wiring line 113 that connects the alternating current source to the pixel portion.

Forward bias is applied to the organic light emitting element as follows. The electric potential of the gate of the current controlling TFT 102 is set lower than the electric potential of the power supply line ($V_i$) to exceed the threshold while the electric potential of the opposite electrode of the organic light emitting element 105 is set to the Lo level and the electric potential of the power supply line is set to the Hi level. Then, the current controlling TFT is turned ON, namely, conductive. Forward bias is thus applied to the organic light emitting element and voltage is applied to the rectifying element 109 in the reverse direction.

Reverse bias is applied to the organic light emitting element as follows. The electric potential of the opposite electrode of the organic light emitting element 105 is set to the Hi level and the electric potential of the power supply line ($V_i$) is set to the Lo level. At this time, voltage is applied to the rectifying element 109 in the forward direction in spite of that the gate electric potential of the current controlling TFT is high or low, and thus reverse bias is applied to the organic light emitting element.

In the circuit where the rectifying element 109 is connected in parallel to the semiconductor layer of the current controlling TFT 102, the resistance is reduced to a low level enough to let in flowing current in at least one of the rectifying element or the semiconductor layer of the current controlling TFT in accordance with the polarity of the voltage outputted from the alternating current source 106. In this way, voltage can be applied to the organic light emitting element by the alternating current source whether it is forward bias or reverse bias.

In order to drive with alternating current, the forward direction of the rectifying element 109 is set reverse to the direction of the current flowing in the current controlling TFT 102 being ON. In other words, the forward direction of the rectifying element 109 is reverse to the forward direction of the organic light emitting element 105 that has the diode structure.

The circuit shown in FIG. 17 is merely an example of the present invention, and the conductivity of the current controlling TFT 102, the rectifying direction of the rectifying element 109, and the rectifying direction of the organic light emitting element 105 that has the diode structure can be set freely as long as the effects of the present invention are obtained.

FIGS. 18A and 18B show examples of waveform chart in driving an organic light emitting element with alternating current. The axis of abscissa indicates time and the axis of ordinate indicates voltage. When a signal is inputted from an alternating current source to drive an organic light emitting element, the electric potential ($V_c$) of an opposite electrode is kept constant whereas the electric potential ($V_{pi}$) of a power supply line is changed in a driving method shown in FIG. 18A. On the other hand, the electric potential ($V_c$) of an opposite electrode and the electric potential ($V_{pi}$) of a power supply line are both changed in a driving method shown in FIG. 18B. Either of the two driving methods can be employed.

However, it is generally preferred to employ the driving method of FIG. 18B in which the electric potential of an opposite electrode and the electric potential of a power supply line are both changed. The amplitude of voltage outputted from an alternating current source is smaller in the driving method of FIG. 18B than in the driving method of FIG. 18A and therefore the method of FIG. 18B is capable of reducing the cost of alternating current source by using a low-voltage driving alternating current source. When the amplitude of voltage of an alternating current source is smaller, load on circuits that constitute the alternating current source is reduced to improve the reliability of the alternating current source. Furthermore, it is also advantageous in terms of reduction of cost to require less power supply systems in total.

The structure of a display device according to the present invention is described below.

The present invention provides a display device comprising a plurality of pixels each comprising a transistor, an organic light emitting element, and a rectifying element, characterized in that:

the transistor has a source and a drain, one of which is connected to a pixel electrode of the organic light emitting element and the other of which is connected to one terminal of an alternating current source;

the rectifying element is connected to the terminal and to the pixel electrode of the organic light emitting element;

an opposite electrode of the organic light emitting element is connected to the other terminal of the alternating current source; and a forward direction of the rectifying element is reverse to forward bias of the organic light emitting element.

The present invention provides a display device comprising a plurality of pixels each comprising a switching transistor, a current controlling transistor, a rectifying transistor, and an organic light emitting element, characterized in that:

a gate of the switching transistor is connected to a gate signal line;

the switching transistor has a source and a drain, one of which is connected to a source signal line and the other of which is connected to a gate of the current controlling transistor;

the current controlling transistor has a source and a drain, one of which is connected to one terminal of an alternating current source and the other of which is connected to a pixel electrode of the organic light emitting element;

a gate of the rectifying transistor is connected to the terminal;

the rectifying transistor has a source and a drain, one of which is connected to the terminal and the other of which is connected to the pixel electrode of the organic light emitting element;

an opposite electrode of the organic light emitting element is connected to the other terminal of the alternating current source; and a forward direction of the rectifying transistor is reverse to forward bias of the organic light emitting element.

In the above structure, the display device is characterized in that:

the pixel electrode of the organic light emitting element is an anode and the opposite electrode thereof is a cathode; and the current controlling transistor and the rectifying transistor have a p type conductivity.

Alternatively, the display device in the above structure is characterized in that:

the pixel electrode of the organic light emitting element is a cathode and the opposite electrode thereof is an anode; and the current controlling transistor and the rectifying transistor have an n type conductivity.

In the above structures, the display device is characterized in that the transistor is a thin film transistor, or the switching transistor, the current controlling transistor, and the rectifying transistor are thin film transistors.

In the above structures, the display device is characterized in that the plural pixels are integrated with a driving circuit for driving the plural pixels on a glass substrate.

The present invention provides a method of driving a display device comprising a plurality of pixels each comprising a transistor, a rectifying element, and an organic light emitting element, the transistor has a source and a drain, one of which is connected to one terminal of an alternating current source and the other of which is connected to a pixel electrode of the organic light emitting element, one side of the rectifying element is connected to the terminal and the other is connected to the pixel electrode of the organic light emitting element, and an opposite electrode of the organic light emitting element is connected to the other terminal of the alternating current source, the method being characterized in that:

reverse bias is applied to the organic light emitting element when voltage is applied by the alternating current source in a forward direction of the rectifying element; and the reverse bias applied to the organic light emitting element is lifted when voltage is applied in a reverse direction of the rectifying element.

The present invention provides a method of driving a display device comprising a plurality of pixels each comprising a switching transistor, a current controlling transistor a rectifying transistor, and an organic light emitting element, the switching transistor has a gate that is connected to a gate signal line, the switching transistor has a source and a drain, one of which is connected to a source signal line and the other of which is connected to a gate of the current controlling transistor, the current controlling transistor has a source and a drain, one of which is connected to one terminal of an alternating current sources and the other of which is connected to a pixel electrode of the organic light emitting element, the rectifying transistor has a gate that is connected to the terminal, the rectifying transistor has a source and a drain one of which is connected to the terminal and the other of which is connected to the pixel electrode of the organic light emitting element, and the organic light emitting element has an opposite electrode that is connected to the other terminal of the alternating current source, the method being characterized in that:

reverse bias is applied to the organic light emitting element when voltage is applied by the alternating current source in a forward direction of the rectifying transistor; and the reverse bias applied to the organic light emitting element is lifted when voltage is applied in a reverse direction of the rectifying transistor.

In the above structures, the method of driving a display device is characterized in that:

an address period in which a data signal is inputted to the organic light emitting element and a sustain period in which the organic light emitting element emits or does not emit light in accordance with the inputted data signal are provided; and a polarity of voltage outputted from the alternating current source is changed when the address period is ended to start the sustain period.

In the above structures, the method of driving a display device is characterized in that a waiting period in which a voltage with the same polarity as the voltage in the address period is outputted from the alternating current source is interposed between the address period and the sustain period.

In the above structures, the method of driving a display device is characterized in that the plurality of address periods and the plurality of sustain periods with different lengths make one frame period for time ratio gray scale display.

In the above structures, the method of driving a display device is characterized in that the electric potential of the pixel electrode of the organic light emitting element and the electric potential of the opposite electrode are changed simultaneously when the reverse bias is applied to the organic light emitting element by the alternating current sources.

The present invention structured as above will be described in detail through the following embodiment modes and embodiments. The embodiment modes and embodiments may be used as appropriate in combination. The use of the structure of the present invention is not limited to the following embodiment modes and embodiments.

BRIEF DESCRIPTION OF THE DRAWINGS

In the accompanying drawings:

FIG. 7 is a timing chart of driving for analog gray scale display in accordance with Embodiment Mode 4 of the present invention;

FIG. 13 is a circuit diagram of a pixel of the organic light emitting display according to Embodiment 1 of the present invention;

FIG. 14 is a perspective view showing the exterior of an organic light emitting display according to Embodiment 3 of the present invention;

DETAILED DESCRIPTION OF THE PREFERRED EMBODIMENTS

[Embodiment Mode 1]

Described here is an example of applying the structure of the present invention to an organic light emitting display in which gray scale display is performed through time division driving. The gray scale display through time division driving is a method of gray scale display in which gray scales of pixels are controlled by combining several periods that have different time for light emission.

Figure 1A:
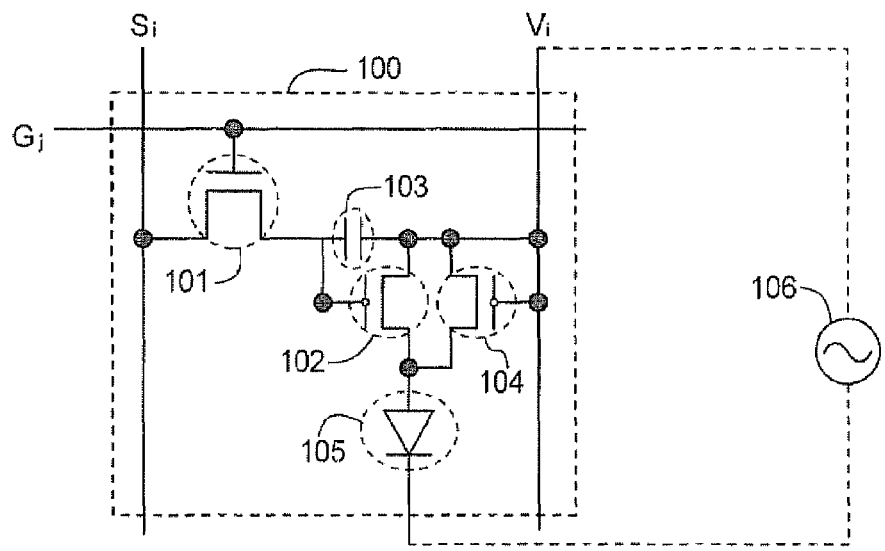
FIGS. 1A and 1B are examples of circuit diagrams of a pixel and a pixel portion in an organic light emitting display of the present invention.

FIG. 1A is an equivalent circuit of a pixel. Each pixel is denoted by 100 and receives signals from a gate signal line ($G_j$) and a source signal line ($S_i$). Each pixel has a switching TFT 101, a current controlling TFT 102, a capacitor 103, a rectifying TFT 104, and an organic light emitting element 105. An alternating current source 106 gives electric potentials to a power supply line ($V_i$) and an opposite electrode of the organic light emitting element 105.

A gate electrode of the switching TFT 101 is connected to the gate signal line ($G_j$) for inputting a selection signal. The switching TFT has a source and a drain, one of which is connected to the source signal line ($S_i$) for inputting a digital image data signal (hereinafter referred to as digital data signal) which has information of '0' or '1' and the other of which is connected to a gate electrode of the current controlling TFT 102 and to one of electrodes of the capacitor 103. The other electrode of the capacitor is connected to the power supply line ($V_i$). The capacitor 103 is provided to hold the gate voltage of the current controlling TFT 102 when the switching TFT 101 is not selected.

The current controlling TFT 102 has a source and a drain, one of which is connected to the power supply line ($V_i$) and the other of which is connected to the pixel electrode of the organic light emitting element 105.

The rectifying TFT 104 has a source and a drain, one of which is connected to the power supply line ($V_i$) and the other of which is connected to the pixel electrode of the organic light emitting element 105. A gate electrode of the rectifying TFT 104 is connected to the power supply line ($V_i$). The gate electrode of the rectifying TFT 104 is connected to the source or drain thereof. Accordingly, the rectifying TFT 104 has a rectifying characteristic that allows current to flow only in one direction.

The rectifying TFT 104 and the current controlling TFT 102 desirably have the same conductivity type. In this embodiment mode, the current controlling TFT and the rectifying TFT have the p type conductivity. The switching TFT 101 may have the n type conductivity or the p type conductivity.

Since the rectifying TFT is a p-channel TFT and its gate is connected to its source or drain, the rectifying characteristic of the rectifying TFT 104 makes it easy for current to flow from the organic light emitting element side to the power supply line side and difficult in the other direction.

The organic light emitting element 105 is composed of an organic compound layer, an anode, and a cathode with the organic compound layer sandwiched between the anode and the cathode. In this embodiment mode, a pixel electrode of the organic light emitting element, which is connected to the current controlling TFT 102 and to the rectifying TFT 104, serves as the anode, and an opposite electrode of the organic light emitting element serves as the cathode. Current flows from the pixel electrode to the opposite electrode to cause the organic light emitting element to emit light.

The alternating current source 106 is connected to the opposite electrode of the organic light emitting element 105 and to the power supply line ($V_i$). In this embodiment mode, the electric potential of the opposite electrode and the electric potential of the power supply line are simultaneously changed for alternating current driving. The difference between the electric potential of the opposite electrode and the electric potential of the power supply line is set to a level that causes the organic light emitting element to emit light when the current controlling TFT is turned ON.

An opposite mode to this embodiment mode may be employed, in which the current controlling TFT and the rectifying TFT are n-channel TFTs, the pixel electrode of the organic light emitting element serves as a cathode whereas the opposite electrode thereof serves as an anode, and current flows from the opposite electrode to the pixel electrode to cause the organic light emitting element to emit light.

Figure 1B:
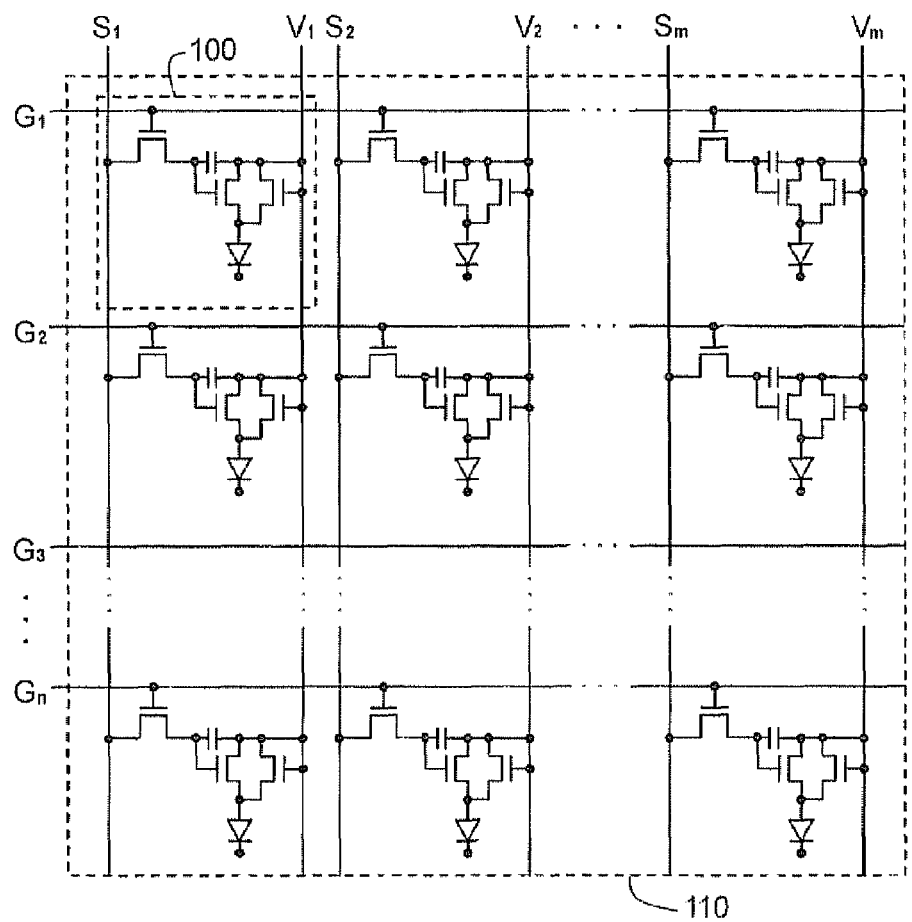

FIG. 1B is an equivalent circuit of a pixel portion. In a pixel portion 110, the pixel 100 and similarly structured pixels are arranged to form a matrix and signals are inputted to the respective pixels from gate signal lines ($G_1$ to $G_n$), source signal lines ($S_1$ to $S_m$), and an alternating current source (not shown in the drawing) to control the luminance of the pixels.

The gate signal lines ($G_1$ to $G_n$) are connected to gate electrodes of switching TFTs of the respective pixels. Each switching TFT has a source and a drain, one of which is connected to one of the source signal lines ($S_1$ to $S_m$) and the other of which is connected to a capacitor and to a gate electrode of a current controlling TFT.

Each current controlling TFT has a source and a drain, one of which is connected to one of power supply lines ($V_1$ to $V_m$) and the other of which is connected to a pixel electrode of an organic light emitting element. A gate electrode of a rectifying TFT is connected to one of the power supply lines ($V_1$ to $V_m$). Each rectifying TFT has a source and a drain, one of which is connected to one of the power supply lines ($V_1$ to $V_m$) and the other of which is connected to the pixel electrode of the organic light emitting element. An opposite electrode of each organic light emitting element and the power supply lines ($V_1$ to $V_m$) are connected to the alternating current source.

In order to simplify the explanation, the pixels in this embodiment mode emit light for a single color and the relation between the voltage applied to the organic light emitting element and the intensity of light emitted from the organic light emitting element is the same for all of the pixels that form a matrix in the pixel portion. Accordingly, all the pixels in the pixel portion have the same electric potential from the power supply lines ($V_1$ to $V_m$) and the opposite electrodes of all the pixels in the pixel portion have the same electric potential.

Described next is a method of driving an organic light emitting display that has the pixel portion circuit of FIGS. 1A and 1B. First, an example of gray scale display by time division driving according to this embodiment mode will be described with reference to FIG. 2.

One frame period (F) is divided into n sub-frame periods ($SF_1$ to $SF_n$). To simplify the explanation, only a first sub-frame period ($SF_1$) and a second sub-frame period ($SF_2$) are shown in the drawing. One frame period refers to a period for forming one image with controlled gray scales. In this embodiment mode, 60 or more frame periods are provided in one second. When less than 60 images are displayed in one second, flicker or the like is recognizable to the eye.

Sub-frame periods ($SF_1$ to $SF_n$) are periods obtained by dividing one frame period. As the number of gray scales is increased, one frame period is divided into more sub-frame periods and a driving circuit has to be driven at higher frequency.

One sub-frame period is divided into an address period (Ta) and a sustain period (Ts). An address period is a period required to input data to all pixels in one sub-frame period and a sustain period is a period in which a constant current flows into an organic light emitting element to perform display in accordance with data inputted to the pixels.

Address periods ($Ta_1$ to $Ta_n$) of n sub-frame periods ($SF_1$ to $SF_n$) have the same length. Sustain periods ($Ts_1$ to $Ts_n$) of n sub-frame periods ($SF_1$ to $SF_n$) have different lengths.

Lengths of sustain periods are set so as to satisfy $Ts_1:Ts_2:Ts_3: \ldots :Ts_{(n-2)}:Ts_{(n-1)}:Ts_n = 2^1:2^2:2^3: \ldots :2^{(n-2)}:2^{(n-1)}$. Lengths of sustain periods differ from one sub-frame period to another sub-frame period. The order of sub-frame periods ($SF_1$ to $SF_n$) is not fixed. A desired gray scale out of $2^n$ gray scales is obtained by combining the sustain periods.

Figure 2:
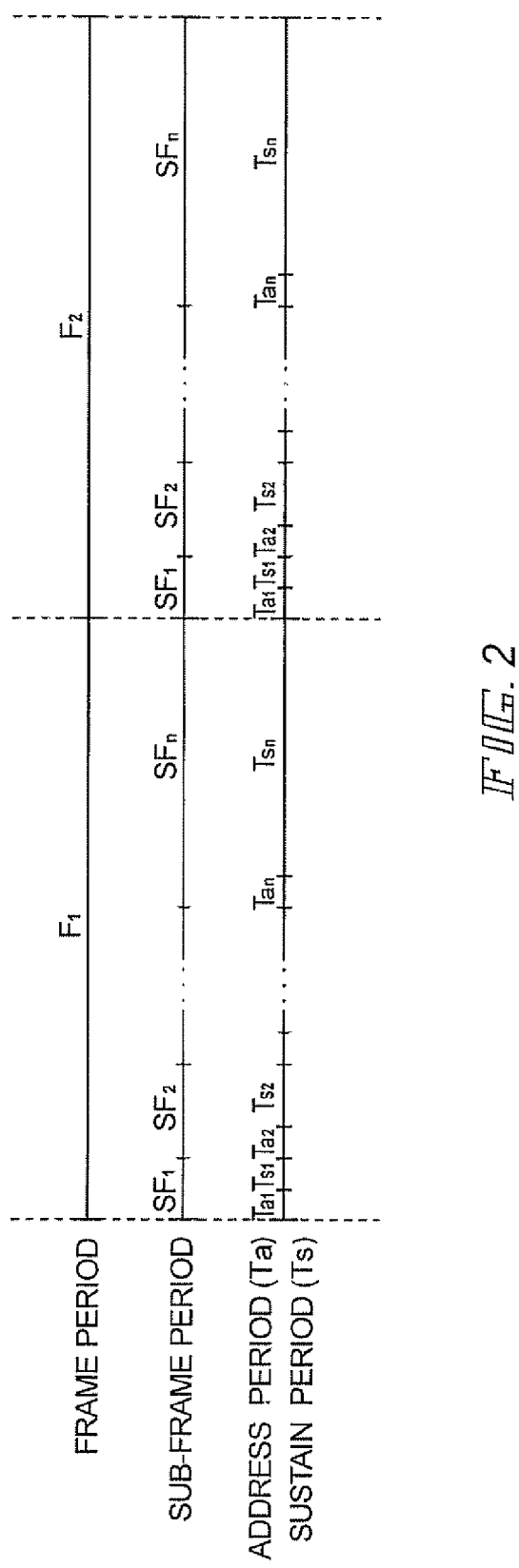
FIG. 2 is a timing chart of driving for time ratio gray scale display in accordance with Embodiment Mode 1 of the present invention.
Figure 3:
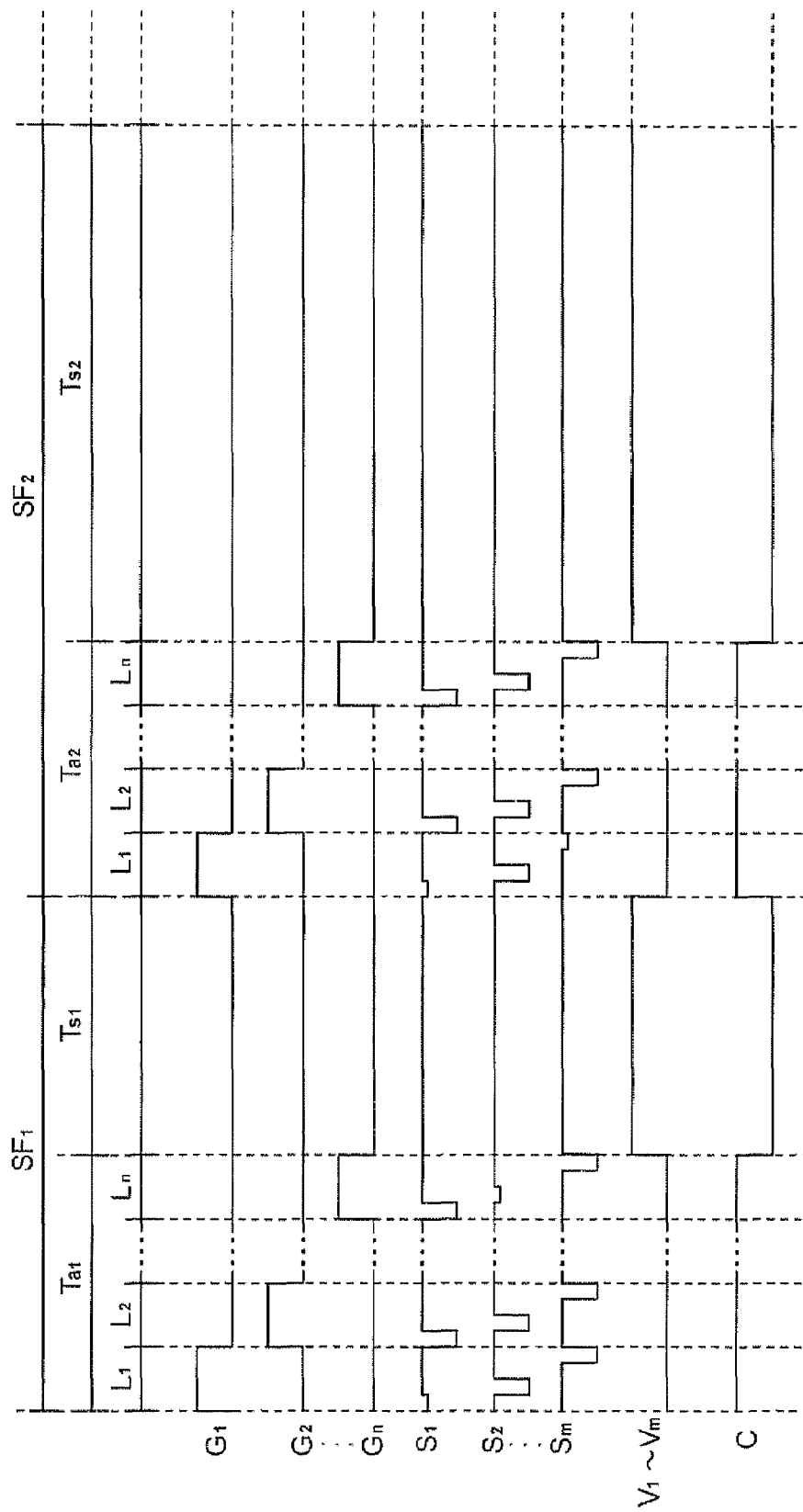
FIG. 3 is a timing chart of driving for time ratio gray scale display in accordance with Embodiment Mode 1 of the present invention.

Next, signals inputted to pixels for time division gray scale display according to the timing shown in FIG. 2 are described with reference to a timing chart of FIG. 3. To simplify the explanation, only a first sub-frame period and a second sub-frame period out of one frame period are shown in FIG. 3.

A first sub-frame period ($SF_1$) consists of a first address period ($Ta_1$) and a first sustain period ($Ts_1$). The address period is divided into a first line period ($L_1$) to an n-th line period ($L_n$).

In the first line period ($L_1$), a selection signal is inputted to a gate signal line ($G_1$) and every switching TFT that is connected to the gate signal line ($G_1$) is turned ON.

While every switching TFT that is connected to the gate signal line ($G_1$) is turned ON, digital data signals are inputted to source signal lines ($S_1$ to $S_m$) in order.

The digital data signals inputted to the source signal lines ($S_1$ to $S_m$) are inputted to gate electrodes of current controlling TFTs through the switching TFTs that are ON. The digital data signals are also input and stored in capacitors.

Since the digital data signals are stored in the capacitors, the electric potential of the gate electrodes of the current controlling TFTs is held after the switching TFts connected to the gate signal line ($G_1$) are turned OFF.

When the digital data signal are inputted to a source signal line ($S_m$) of the m-th column, the first line period ($L_1$) is ended. Alternatively, one line period may be composed of a period for which input of digital data signals to the source signal lines ($S_1$ to $S_m$) is completed and a horizontal retrace period.

The second line period ($L_2$) is a period in which a selection signal is inputted to a gate signal line ($G_2$) and every switching TFT that is connected to the gate signal line ($G_2$) is turned ON. While every switching TFT that is connected to the gate signal line ($G_2$) is turned ON, digital data signals are inputted to the source signal lines ($S_1$ to $S_m$) in order. The digital data signals are inputted to gate electrodes of current controlling TFTs through the switching TFTs. The digital data signals are also input and stored in capacitors.

The operation described above is repeated until the n-th line period is ended to complete inputting digital data signals to all of the pixels. In other words, a period required to input digital data signals to all pixels is an address period. Alternatively, one address period may be composed of a period required to input digital data signals to all pixels and a vertical retrace period.

During an address period, the electric potential of the power supply lines ($V_1$ to $V_n$) is kept lower than the electric potential of the gate electrode of the current controlling TFT. The current controlling TFT is therefore turned OFF. On the other hand, voltage is applied to the rectifying TFT in the forward direction and reverse bias is applied to the organic light emitting element through the rectifying TFT. At this point, no current flows in the organic light emitting element and the organic light emitting element keeps emitting no light.

When the first address period ($Ta_1$) is ended, the first sustain period ($Ts_1$) is started. With the start of the sustain period, the polarity of the voltage outputted from the alternating current source is changed. The change in waveform inputted from the alternating current source sets the electric potential of the power supply lines ($V_1$ to $V_n$) higher than the electric potential (C) of the opposite electrode.

If the current controlling TFT is turned ON and voltage larger than the threshold is applied to the organic light emitting element during the sustain period, the organic light emitting element emits light. On the other hand, the current controlling TFT is kept turned OFF in a pixel where a digital data signal of 'no light emission' is written in the gate of the current controlling TFT. In either case, the reverse bias that has been applied to the organic light emitting element during the address period is lifted.

Alternating current driving is achieved in this way and voltages applied to the organic light emitting element in an address period and in a sustain period have different polarities in an arbitrary sub-frame period in which the organic light emitting element emits light. However, note that this method is not the only method for alternating current driving using the circuit of the present invention.

As the first sustain period is ended, the polarity of the voltage outputted from the alternating current source is changed to finish the first sub-frame period. As the first sub-frame period is ended, the second sub-frame period is started.

When the first sustain period is ended and the polarity of the voltage outputted from the alternating current source is changed, the electric potential of the gate of the current controlling TFT is set higher than the electric potential of the power supply lines. The current controlling TFT is turned OFF and the rectifying TFT is turned ON to apply reverse bias voltage to the organic light emitting element of every pixel. Then no organic light emitting element emits light.

In the second sub-frame period, when the second address period is started, digital data signals are inputted to the pixels in order from the first line period through the n-th line period. After completing inputting digital data signals to all of the pixels to end the second address period, the second sustain period is started. As the second sustain period is ended, the second sub-frame period is completed.

Subsequently, the same operation is repeated in the third through n-th sub-frame periods. Each sub-frame period has one address period and one sustain period, and one image is displayed in each sustain period.

As the n-th sub-frame period is ended, the first frame period is completed. At this point, the gray scale of a pixel is determined by adding up lengths of sustain periods in which the pixel emits light.

As described above, an organic light emitting element can be driven with alternating current. The present invention is applicable to an organic light emitting display for time division driving.

According to this embodiment mode, the polarity of voltage applied to an organic light emitting element can be changed for alternating current driving simply by providing a rectifying TFT in each pixel and using an alternating current source to change both the electric potential of power supply line and electric potential of opposite electrode.

[Embodiment Mode 2]

In a color organic light emitting display, a material of a light emitting layer may differ among a pixel that emits red light, a pixel that emits blue light, and a pixel that emits green light, and the relation between the voltage applied to the organic light emitting element and the intensity of light emitted from the organic light emitting element may vary among pixels of different colors. In this case, one of the electric potential of power supply line and the electric potential of opposite electrode may vary among pixels of different colors.

Figure 4:
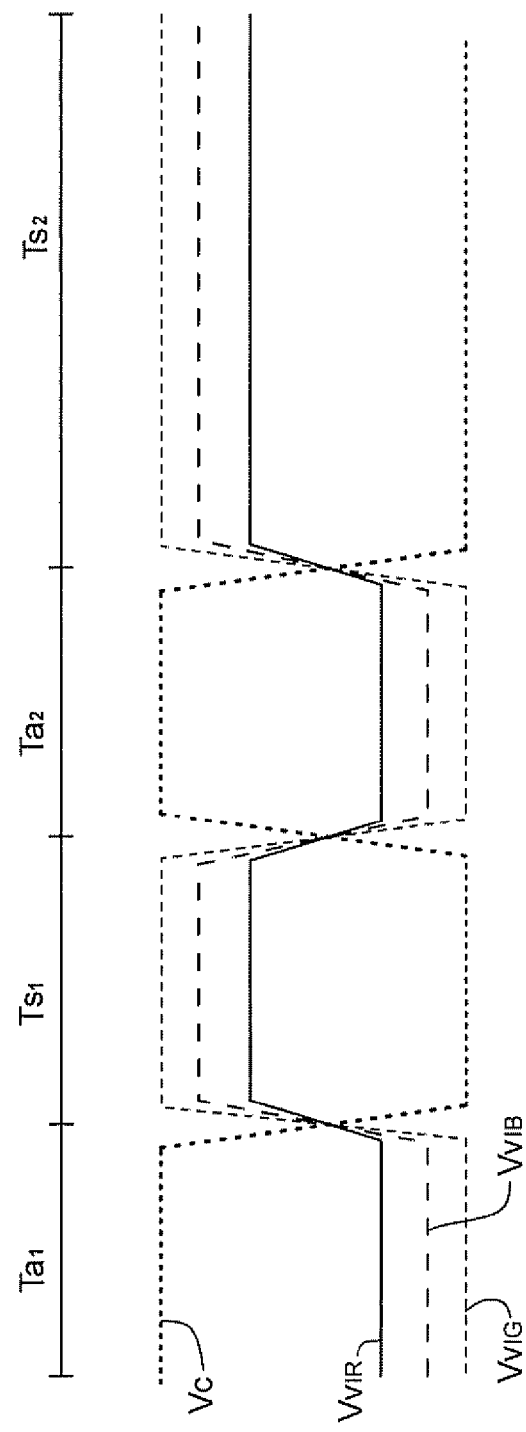
FIG. 4 is an example of waveform chart showing a method of driving an organic light emitting element with alternating current in accordance with Embodiment Mode 2 of the present invention.

For example, a driving method of an organic light emitting display, as illustrated in the waveform of FIG. 4, can be employed. The diagram show electric potentials given by an alternating current source to a power supply line and to an opposite electrode of an organic light emitting element. The electric potential of the power supply line varies in accordance with the color of light emitted from a pixel. The axis of abscissa indicates time and the axis of ordinate indicates voltage. To simplify the explanation, only a first sub-frame period ($SF_1$) and a second sub-frame period ($SF_2$) are shown in the drawing. A plurality of sub-frame periods that constitute one frame period are divided into address periods ($Ta_1$ to $Ta_n$) and sustain periods ($Ts_1$ to $Ts_n$). The waveform outputted from the alternating current source is changed when an address period is ended to start a sustain period. The electric potential of a power supply line is set with the electric potential ($V_C$) of an opposite electrode as the reference. The electric potential ($V_{viR}$) of a power supply line of a pixel that emits red light, the electric potential ($V_{viB}$) of a power supply line of a pixel that emits blue light, and electric potential ($V_{viG}$) of a power supply line of a pixel that emits green light are different from one another.

In the case of displaying a color image by transmitting white light that is emitted from an organic light emitting element through color filters, or in the case of monochrome display, every pixel uses a common material for the light emitting layer of the organic light emitting element. Then all the pixels may have the same opposite electrode electric potential and the same power supply line electric potential. An example, in which all power supply lines ($V_1$ to $V_m$) have the same electric potential and every opposite electrode (C) has the same electric potential, has already been described in Embodiment Mode 1 with reference to FIG. 3.

[Embodiment Mode 3]

In this embodiment mode, a sustain period is started by changing the polarity of the alternating current voltage outputted from an alternating current source after a certain waiting period which is subsequent to an address period.

Figure 5:
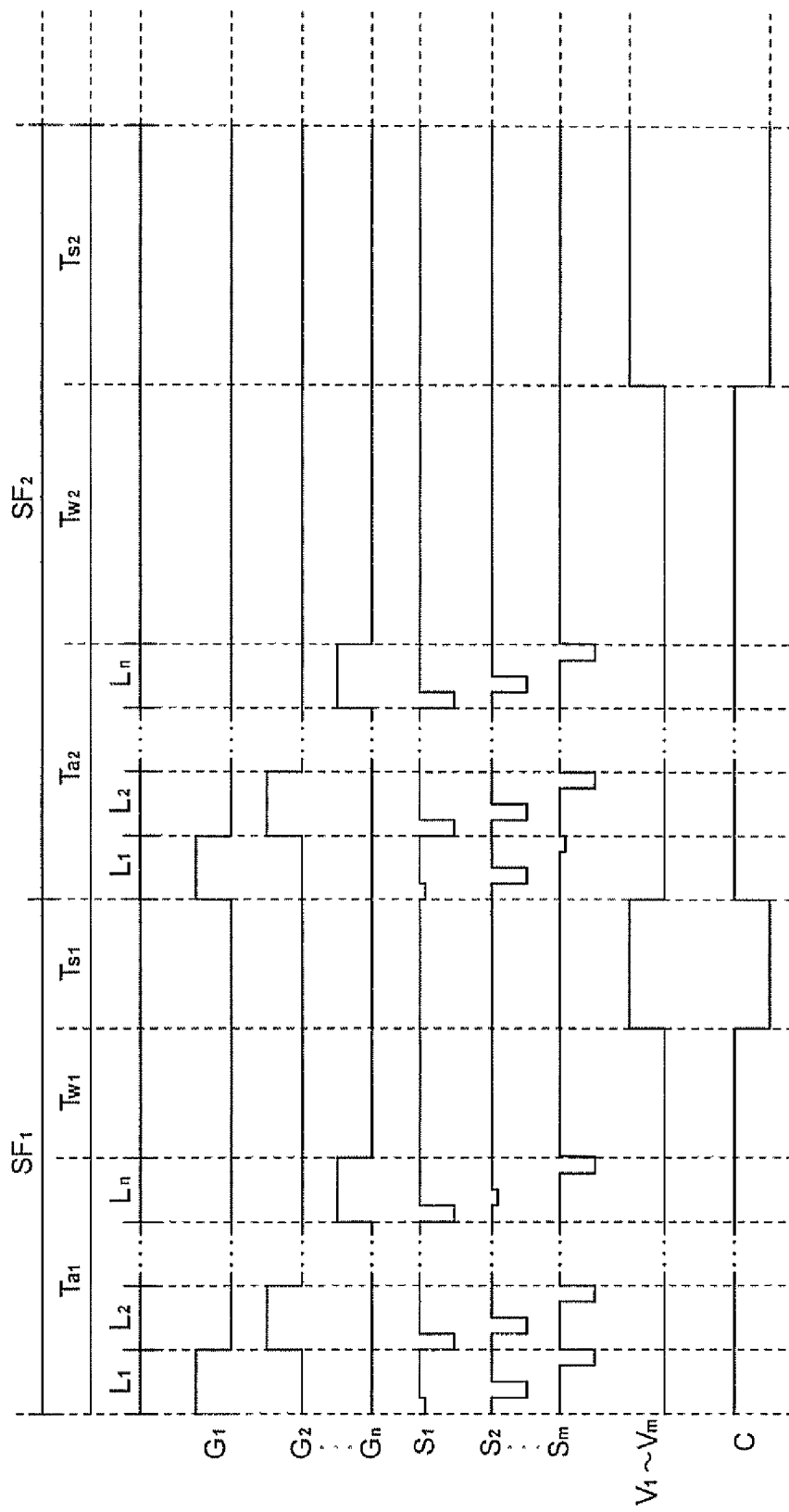
FIG. 5 is a timing chart of driving for time ratio gray scale display in accordance with Embodiment Mode 3 of the present invention.

A circuit of a pixel portion in an organic light emitting display of this embodiment mode is the same as the circuit of Embodiment Mode 1. This embodiment mode is different from Embodiment Mode 1 in how the organic light emitting display is driven. The difference between this embodiment mode and Embodiment Mode 1 will be described with reference to a timing chart of FIG. 5, which illustrates driving of the organic light emitting display. In FIG. 5, components which have the same functions as those in FIG. 3 are denoted by the same reference symbols and the description will focus on the difference. For conveniences' sake of explanation, only a first sub-frame period ($SF_1$) and a second sub-frame period ($SF_2$) are shown in the drawing. One sub-frame period (SF) is divided into an address period (Ta), a waiting period (Tw), and a sustain period (Ts).

For example, voltage is applied to the rectifying TFT in the forward direction in a first address period ($Ta_1$) and a first waiting period ($Tw_1$) to apply reverse bias to the organic light emitting element. Therefore the organic light emitting element does not emit light.

After the first waiting period ($Tw_1$) is ended, the waveform outputted from the alternating current source is changed to start a first sustain period ($Ts_1$). When the waveform outputted from the alternating current source is changed, the electric potential of the opposite electrode (C)

of the organic light emitting element and the electric potential of the power supply lines ($V_1$ to $V_m$) are changed.

In the first sustain period, the current controlling TFT is turned ON or OFF in accordance with the digital data signal inputted to the pixel. If the current controlling TFT is turned ON, the organic light emitting element emits light, and the organic light emitting element does not emit light when the current controlling TFT is turned OFF. In either case, the reverse bias voltage applied to the organic light emitting element is lifted.

According to this embodiment mode, how long an organic light emitting element receives reverse bias in one sub-frame period can be adjusted by adjusting the length of waiting period. The switch from a waiting period over to a sustain period is done by merely changing the waveform outputted from the alternating current source and does not require a complicated circuit.

[Embodiment Mode 4]

This embodiment mode describes an example of method for driving an organic light emitting display in which gray scale display is obtained by analog driving. Analog driving is a method of obtaining gray scale display by controlling the intensity of light emitted from an organic light emitting element through analog change in amount of current flowing into the organic light emitting element.

Figure 6A:
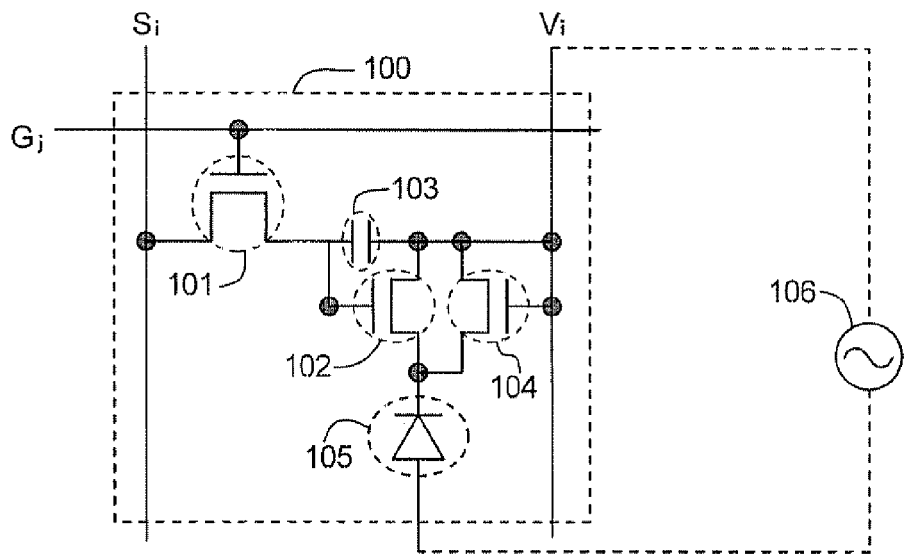
FIGS. 6A and 6B are examples of circuit diagrams of a pixel and a pixel portion in an organic light emitting display in accordance with Embodiment Mode 4 of the present invention.
Figure 6B:
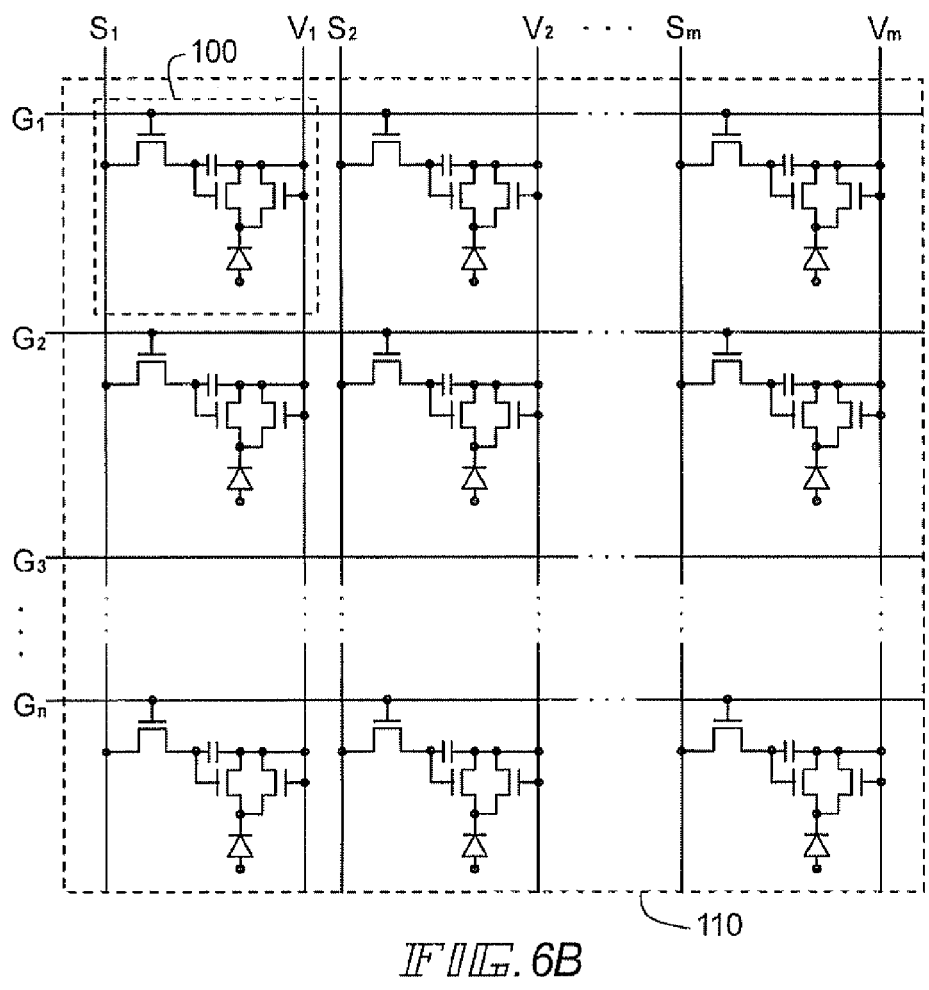

A circuit of a pixel portion of this embodiment mode is shown in FIGS. 6A and 6B. Gate signal lines ($G_1$ to $G_n$) are connected to gate electrodes of switching TFTs of respective pixels. Each switching TFT is denoted by 101. Each switching TFT has a source and a drain, one of which is connected to one of source signal lines ($S_1$ to $S_m$) and the other of which is connected to a gate electrode of a current controlling TFT 102 and to a capacitor 103. Each pixel has one current controlling TFT 102 and one capacitor 103. Each current controlling TFT has a source and a drain, one of which is connected to one of power supply lines ($V_1$ to $V_m$) and the other of which is connected to an organic light emitting element 105. Each pixel has one organic light emitting element 105. Each power supply line is connected to a gate electrode of a rectifying TFT 104 and to the capacitor 103. The rectifying TFT has a source and a drain, one of which is connected to one of the power supply lines and the other of which is connected to a pixel electrode of the organic light emitting element.

In this embodiment mode, the pixel electrode of the organic light emitting element serves as a cathode and the opposite electrode thereof serves as an anode. The current controlling TFT is an n-channel TFT so that a current flows in the organic light emitting element in the forward direction. Similarly to the current controlling TFT, an n-channel TFT is used for the rectifying TFT so that the rectifying TFT has a rectifying effect in the reverse direction to the direction of current flowing into the current controlling TFT in an ON state. The switching TFT may have either the n type conductivity or the p type conductivity.

Since the current controlling TFT is an n-channel TFT, the current controlling TFT is turned ON when the electric potential of the gate of the current controlling TFT is higher than the electric potential of the power supply line over the threshold.

Since the rectifying TFT is an n-channel TFT and the electric potential of its gate electrode is set to the same level as the electric potential of the power supply line, a current flows from the organic light emitting element side to the power supply line side if the current flows in the forward direction.

Figure 8:
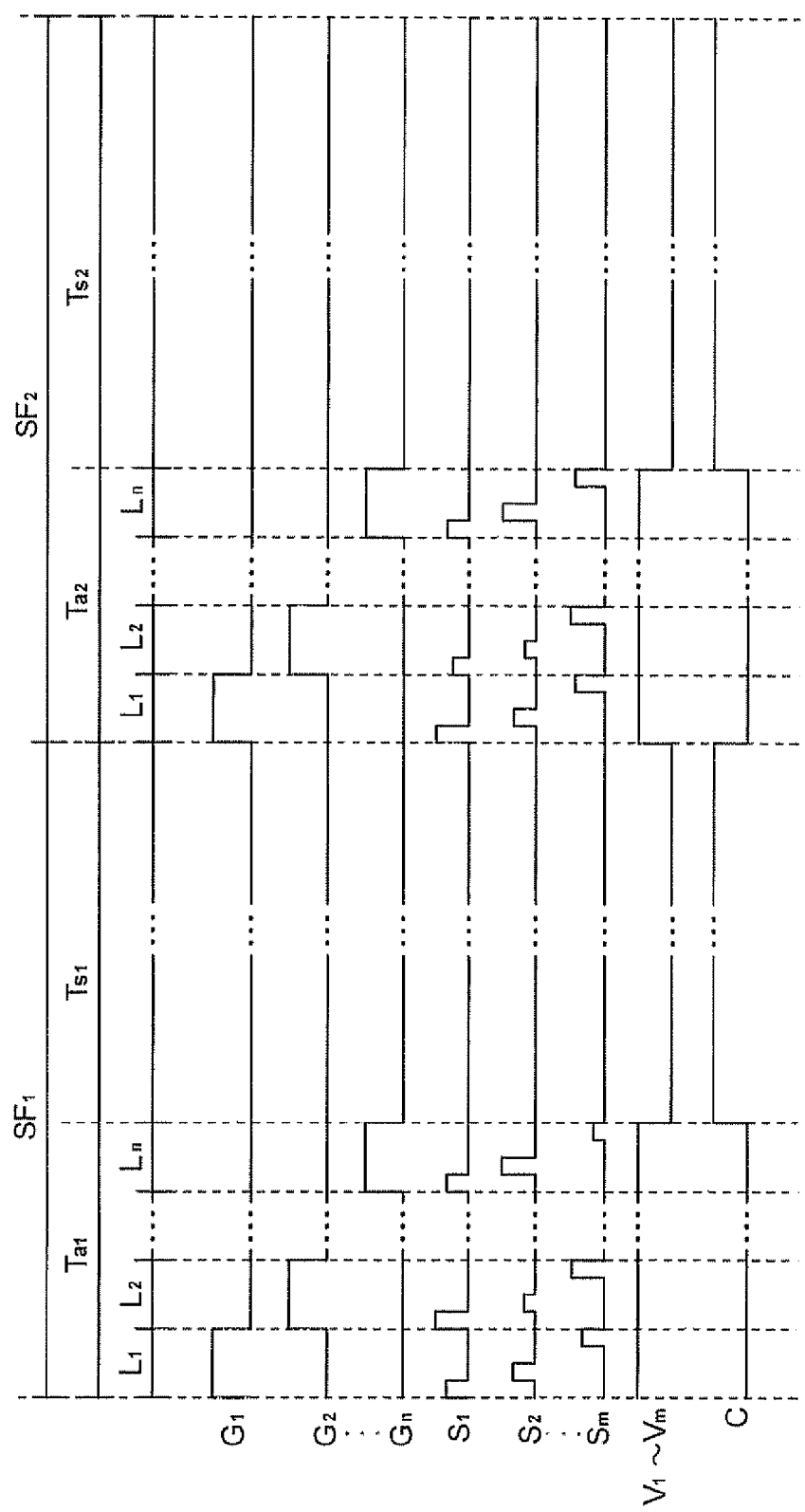
FIG. 8 is a timing chart of driving for analog gray scale display in accordance with Embodiment Mode 4 of the present invention.

FIGS. 7 and 8 are timing charts for analog gray scale driving of an organic light emitting display device that has the circuit shown in FIGS. 6A and 6B.

As shown in the timing chart of FIG. 7, each frame period is divided into one address period (Ta) and one sustain period (Ts). An address period is a period for inputting analog signals to all pixels in order. A sustain period is a period for gray scale display in which a current flows into an organic light emitting element in accordance with the electric potential of an analog signal inputted to a pixel to determine the gray scale of the pixel.

FIG. 8 shows signals inputted to pixels. When a first address period ($Ta_1$) of a first frame period ($F_1$) is started, a first line period ($L_1$) is started simultaneously. The first line period is a period in which a gate signal line ($G_1$) is selected.

There are n gate signal lines and therefore n line periods are provided in one address period. As the resolution becomes higher, the number of ling periods is increased and a driving circuit has to be driven at higher frequency.

In the first line period, a selection signal is inputted to the gate signal line. Data signals (analog data signals) with various analog potentials are inputted to source signal lines ($S_1$ to $S_m$). Since the selection signal is inputted to the gate signal line to turn the switching TFT ON, an analog data signal is inputted to the gate electrode of the current controlling TFT from the source signal line through the switching TFT. The electric potential of the analog data signal is held by a capacitor that is connected to the source or drain of the current controlling TFT and to the power supply line.

When a signal is inputted to the pixel from the source signal line ($S_m$), the first line period ($L_1$) is ended. Alternatively, one line period may be composed of a period required to complete inputting analog video signals to the source signal lines ($S_1$ to $S_m$) and a horizontal retrace period. When the first line period is ended, a second line period is started.

As a second line period ($L_2$) is started, a selection signal is inputted to a gate signal line ($G_2$). Similarly to the first line period ($L_1$), analog video signals are inputted to the source signal lines ($S_1$ to $S_m$) in order.

After finishing inputting selection signals to all the gate signal lines ($G_1$ to $G_n$), all the line periods ($L_1$ to $L_n$) are completed. As the line periods are all ended, one address period is ended. Alternatively, one address period may be composed of all the line periods ($L_1$ to $L_n$) and a vertical retrace period.

In an address period, voltage is applied to the rectifying TFT that has a rectifying characteristic in the forward direction to apply reverse bias to the organic light emitting element. Therefore, the organic light emitting element does not emit light.

A sustain period is started as the address period is ended. With the sustain period is started, the polarity of voltage outputted from the alternating current source is inverted.

When the polarity of voltage outputted from the alternating current source is inverted, current flows into the current controlling TFT in accordance with the level of the gate voltage of the current controlling TFT. The amount of current flowing into the current controlling TFT is controlled by the level of electric potential of the analog data signal inputted to its gate during the address period.

The intensity of light emitted from the organic light emitting element is controlled by the amount of current flowing into the current controlling TFT. As the next address period is started, reverse bias is applied to the organic light emitting element. voltage with a different polarity is applied to the organic light emitting element in the sustain period from the address period for alternating current driving.

The rectifying TFT has a rectifying characteristic and voltage is applied to the rectifying TFT in the reverse direction to the rectifying characteristic during a sustain period. Therefore, no current flows in the rectifying TFT in a sustain period.

As the sustain period is ended, the polarity of the voltage outputted from the alternating current source is changed. When the sustain period of the first frame period is ended, the second frame period is started to start the address period of the second frame period. Subsequently, the same operation is repeated and an image with controlled gray scales is displayed in each frame period.

Reverse bias is applied to an organic light emitting element during an address period in this embodiment mode. However, the present invention is not limited thereto. Forward bias may be applied to an organic light emitting element in an address period and sustain period whereas reverse bias is applied to the organic light emitting element in a waiting period by appropriately changing the waveform outputted from the alternating current source.

[Embodiment Mode 5]

The present invention can freely change lengths of time in which voltages with different polarities are applied to an organic light emitting element by changing the timing of inverting the electric potential of a power supply line and the electric potential of an opposite electrode of the organic light emitting element in analog driving.

A circuit of a pixel portion of this embodiment mode is the same as the circuit illustrated in FIGS. 6A and 6B, and the description is therefore omitted here.

Figure 9:
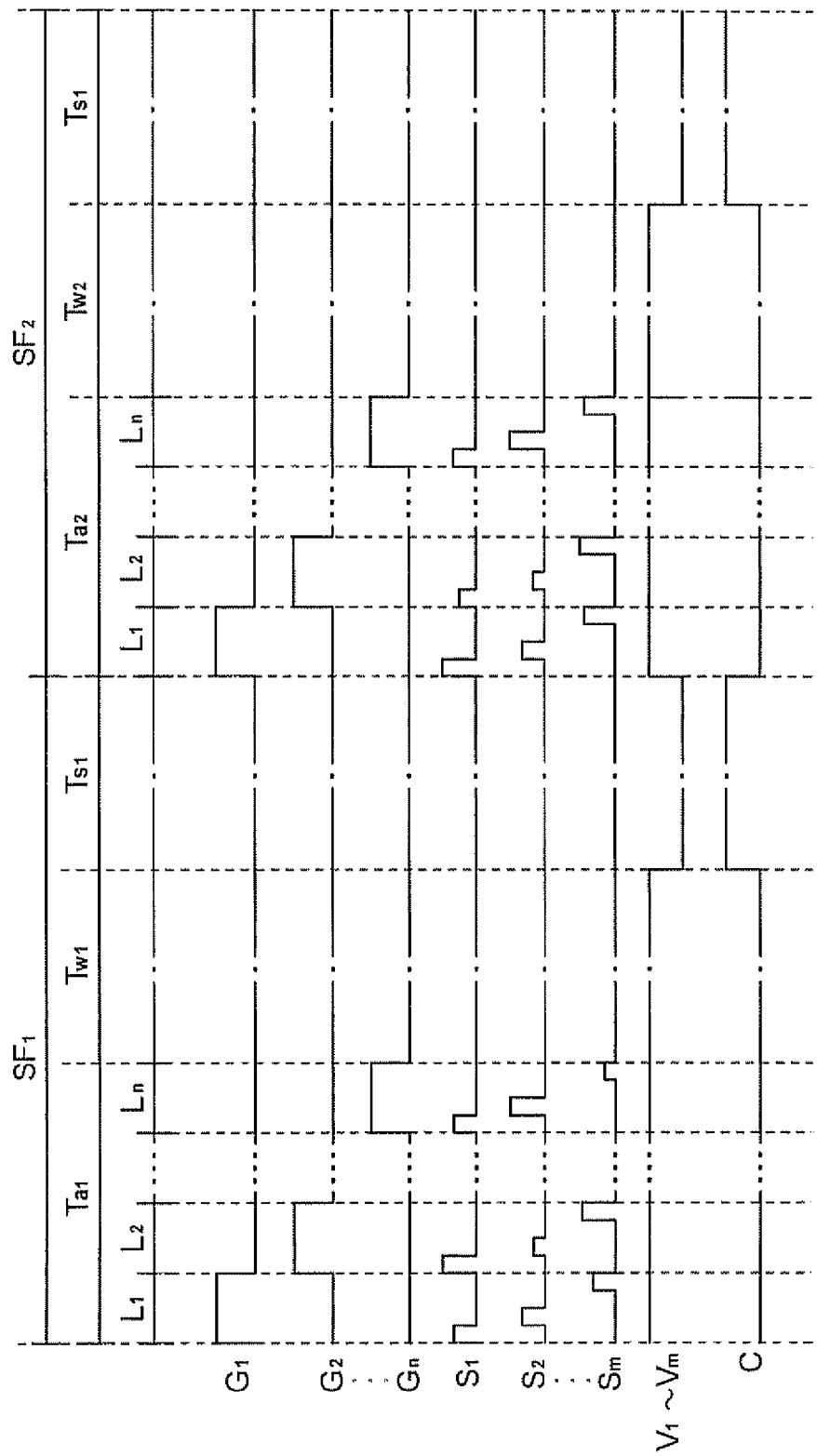
FIG. 9 is a timing chart of driving for analog gray scale display in accordance with Embodiment Mode 5 of the present invention.

FIG. 9 is a timing chart of a driving method according to this embodiment mode. In FIG. 9, components which have the same functions as those in FIG. 8 are denoted by the same reference symbols and difference between FIG. 8 and FIG. 9 will be described.

As an address period (Ta) is ended, a waiting period (Tw) is started, and then the waiting period is ended to start a sustain period (Ts). The electric potential of the power supply line and the electric potential of the opposite electrode of the organic light emitting element are kept constant during an address period and a waiting period, and are inverted as the waiting period is ended and a sustain period is started.

Reverse bias is applied to an organic light emitting element with the diode structure during an address period and a waiting period, and therefore the organic light emitting element does not emit light. In a sustain period, forward bias is applied to an organic light emitting element with the diode structure. In this way, the polarity of the voltage applied to an organic light emitting element in an address period and a waiting period is made different from the polarity of the voltage applied in a sustain period.

By changing the electric potential of power supply line and the electric potential of opposite electrode using an alternating current source, the case of applying voltage to a rectifying TFT in the reverse direction and applying voltage forward bias to an organic light emitting element can be switched to the case of applying voltage to a rectifying TFT in the forward direction and applying voltage to an organic light emitting element in the reverse direction. In short, the polarity of voltage applied to an organic light emitting element is determined by the polarity of voltage outputted from the alternating current source.

In this embodiment mode, the length of time for applying voltage with a different polarity to an organic light emitting element can be set freely by adjusting the length of waiting period.

[Embodiment 1]

Figure 10:
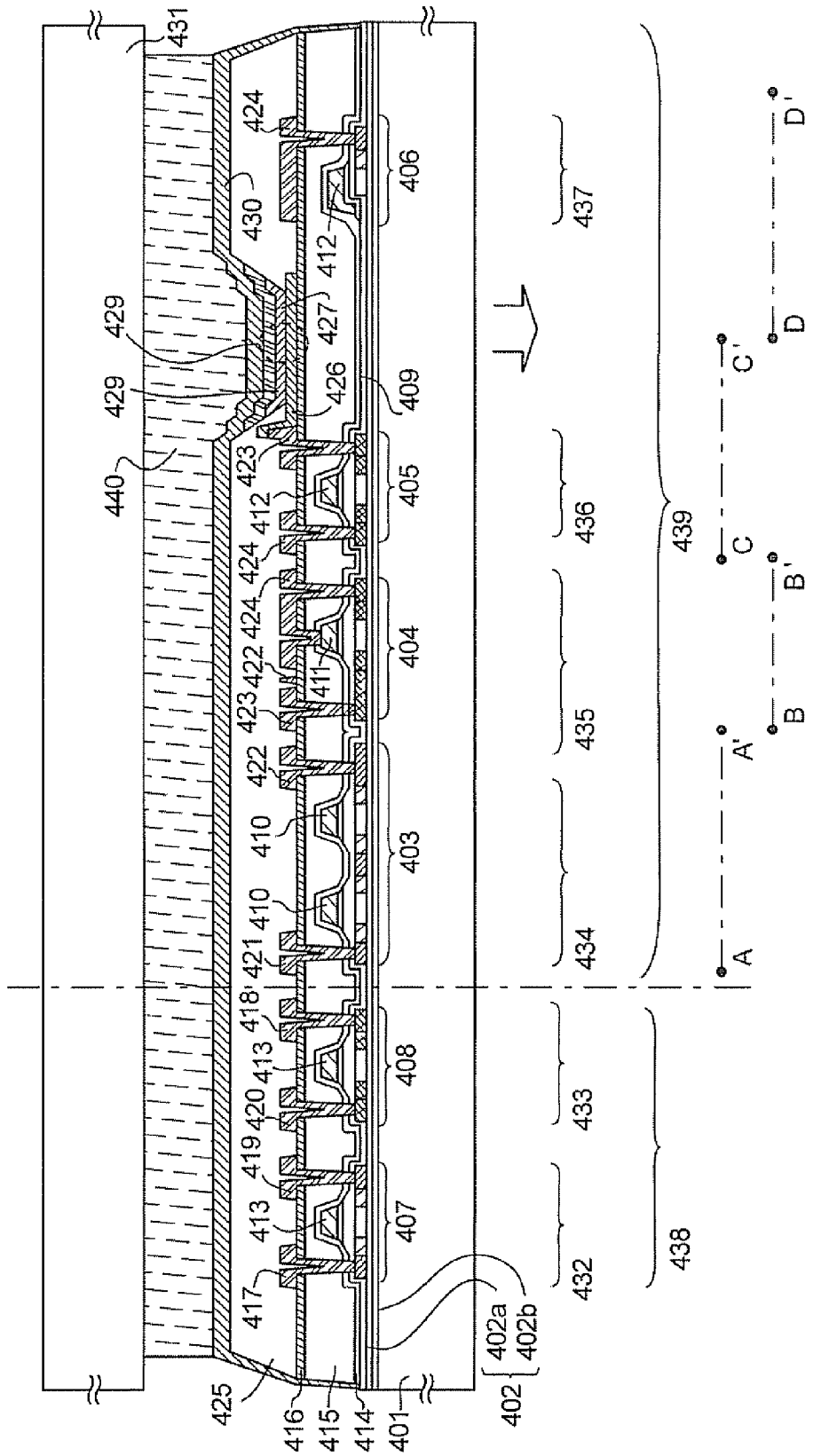
FIG. 10 is a sectional view showing a pixel portion and a driving circuit portion of an organic light emitting display according to Embodiment 1 of the present invention.

The present invention can be applied to every display device that uses an organic light emitting element. FIG. 10 shows an example thereof and an active matrix display device using a TFT is illustrated.

TFTs in the embodiment can be classified into an amorphous silicon TFT and a polysilicon TFTs by a material of a semiconductor layer for forming a channel formation region. The present invention is applicable to both types of TFTs. However, a polysilicon TFT is preferred for a TFT of this embodiment because a polysilicon TFT is high in field effect mobility and therefore can enhance the intensity of light emitted from an organic light emitting element.

A substrate 401 is a quartz substrate or a substrate of glass such as barium borosilicate glass and aluminoborosilicate glass, typical examples of which are Corning #7059 glass and # 1737 glass (products of Corning Incorporated).

Next, an insulating film such as a silicon oxide film, a silicon nitride film, and a silicon oxynitride film is formed as a base film 402. For example, a silicon oxynitride film 402a formed by plasma CVD from $SiH_4$, $NH_3$, and $N_2O$ to have a thickness of 10 to 200 nm (preferably 50 to 100 nm) and a silicon oxynitride film 402b formed by plasma CVD from $SiH_4$ and $N_2O$ to have a thickness of 50 to 200 nm (preferably 100 to 150 nm) are layered. Although the base film 402 in this embodiment has a two-layered structure, the base film may be a single layer or three or more layers of the above insulating films.

Next, a semiconductor layer is formed and patterned to form a first semiconductor layer 403, a second semiconductor layer 404, a third semiconductor layer 405, a fourth semiconductor layer 406, a fifth semiconductor layer 407, and a sixth semiconductor layer 408.

A gate insulating film 409 is formed to cover these semiconductor layers. The gate insulating film is a silicon oxynitride film formed of $SiH_4$ and $N_2O$ and here has a thickness of 10 to 200 nm, preferably 50 to 150 nm.

A tantalum nitride (TaN) film is formed by sputtering and an aluminum alloy film mainly containing aluminum (Al) is formed next. The two layers of conductive films are patterned to form a gate signal line 410, an island-like gate electrode 411, a capacitance electrode 412, and a gate electrode 413. These electrodes are used as masks for self-aligning doping with an impurity element.

Next, a silicon oxynitride film is formed by plasma CVD from $SiH_4$, $NH_3$, and $N_2O$ to have a thickness of 10 to 200 nm (preferably 50 to 100 nm) as a first interlayer insulating film 414. The first interlayer insulating film may be an oxynitride film. An organic resin film with a thickness of 0.5 to 10 μm (preferably 1 to 3 μm) is formed as a second interlayer insulating film 415. The second interlayer insulating film is preferably an acrylic resin film or a polyimide resin film. Desirably, the second interlayer insulating film is thick enough to level the unevenness due to the semiconductor layers, the gate electrodes or the like.

A silicon oxynitride film is formed by plasma CVD from $SiH_4$, $NH_3$, and $N_2O$ to have a thickness of 10 to 200 nm (preferably 50 to 100 nm) as a protective film 416. The protective film prevents leakage of an alkaline component contained in a cathode that is an electrode material constituting an organic light emitting element described later. If the leakage of alkaline component is not avoided, electric characteristics of TFTs is degraded. Although the protective film in this embodiment is a silicon oxynitride film, a silicon nitride film may be used instead of the silicon oxynitride film.

The first interlayer insulating film, the second interlayer insulating film, the protective film, and the gate insulating film are selectively etched to form contact holes. A conductive film is formed so as to cover the contact holes and then patterned. The conductive film is a laminate of a Ti film with a thickness of 50 nm and an alloy film (film of an alloy of Al and Ti) with a thickness of 500 nm.

In a driving circuit portion 438, wiring lines 417 to 420 are formed. In the pixel portion, a source signal line 421, a connection electrode 422, a drain side electrode 423, and a power supply line 424 are formed. The source signal line 421 is connected to a source of a switching TFT 434 and the connection electrode 422 is connected to a drain of the switching TFT 434. Though not shown in the drawing, the connection electrode 422 is connected to the gate electrode 412 of a current controlling TFT 436. The power supply line 424 is connected to a source of the current controlling TFT 436 and the drain side electrode 423 is connected to a drain of the current controlling TFT 436. The gate electrode 412 and drain of a rectifying TFT are connected to the power supply line 424 and a source of the rectifying TFT is connected to the drain side electrode 423. The switching TFT is an n-channel TFT and p-channel TFTs are used for the current controlling TFT and the rectifying TFT.

A power supply line is an electrode common to pixels which have organic light emitting elements that emit red light, another power supply line is an electrode common to pixels which have organic light emitting elements that emit blue light, and still another power supply line is an electrode common to pixels which have organic light emitting elements that emit green light. In short, different power supply lines are provided for different colors of light emitted from organic light emitting elements in the pixel portion.

In this way, the driving circuit portion 438 which has an n-channel TFT 432 and a p-channel TFT 433 and the pixel portion 439 which has the switching TFT 434, the rectifying TFT 435, the current controlling TFT 436, and a storage capacitor 437 can be formed on the same substrate.

Next, an ITO (indium tin oxide) film is formed by vacuum sputtering. The ITO film is patterned for each pixel to be in contact with the drain side electrode 423, to form an anode (pixel electrode) 426 of an organic light emitting element. ITO has as high work function as 4.5 to 5.0 eV and is capable of injecting holes to an organic light emitting layer efficiently.

A photosensitive resin film is formed next. A part of the photosensitive resin film that is inside the perimeter of the anode is removed by patterning to form a bank 425. The organic compound layer described later is formed along the gentle slope of the bank, in order to prevent wire breakage of the organic compound layer at the perimeter of the pixel electrode of the organic light emitting element and prevent short circuit of the pixel electrode and the opposite electrode at the point of the wire breakage.

Next, an organic compound layer 427 of the organic light emitting element is formed by evaporation. The organic compound layer may be a single layer or a laminate. With a laminate structure, the organic compound layer can provide better light emission efficiency. Generally, an organic compound layer is composed of a hole injecting layer, a hole transporting layer, a light emitting layer, and an electron transporting layer which are formed in this order on an anode. Other examples include a structure consisting of a hole transporting layer, a light emitting layer, and an electron transporting layer, and a structure consisting of a hole injecting layer, a hole transporting layer, a light emitting layer, an electron transporting layer, and an electron injecting layer. The present invention may employ any known structure for the organic compound layer.

In this embodiment, a color image is displayed by forming three types of light emitting layers, namely, forming Red light emitting layers, Green light emitting layers, and Blue light emitting layers through evaporation. Specifically, cyanopolyphenylene vinylene is used for a red light emitting layer, polyphenylen vinylene is used for a green light emitting layer, and polyphenylen vinylene or polyalkyl phenylene is used for a blue light emitting layer. Each light emitting layer is 30 to 150 nm in thickness. The above materials are merely examples of organic compounds that can be used for light emitting layers and do not preclude employment of other materials.

A cathode (opposite electrode) 428 of the organic light emitting element is formed next by evaporation. The cathode is formed of a light-reflective material which contains a small amount of alkaline component such as MgAg and LiF. The thickness of the cathode is 100 to 200 nm. The opposite electrode covers the entire surface of the pixel portion to serve as a common electrode to all pixels. The opposite electrode is electrically connected to an FPC (flexible printed circuit) through a wiring line.

The organic light emitting element with the organic compound layer sandwiched between the anode and the cathode is thus completed. The pixel electrode of the organic light emitting element 429 is a transparent electrode, and the opposite electrode thereof is reflective overlaps the anode. Therefore, it is possible that light emitted from the organic light emitting element travels in the direction indicated by the arrow of FIG. 10.

Next, a DLC (diamond like carbon) film is formed as a protective film 430 to prevent degradation of the organic light emitting element due to steam, oxygen, and the like that enter the sealed region of the organic light emitting display.

A substrate with the structure as above is called an active matrix substrate in this specification.

A filler 440 is formed next so as to cover the pixel portion 439 and the driving circuit portion 438. The filler has to be adhesive and capable of bonding a sealing substrate. Examples of the filler include PVC (polyvinyl chloride), an epoxy resin, a silicone resin, PVB (polyvinyl butyral), and EVA (ethylene vinyl acetate). It is preferable to place a drying agent inside the filler because a moisture absorbing effect is provided.

The adhesive filler bonds a sealing substrate 431 to the active matrix substrate to complete sealing of the organic light emitting element.

Then the FPC (flexible printed circuit) is connected to the connection wiring line using an anisotropic conductive resin by a known method. The connection wiring line receives signals from the FPC that serves as a connection terminal to external equipment, and sends the signals to the pixels and the driving circuit.

Figure 11:
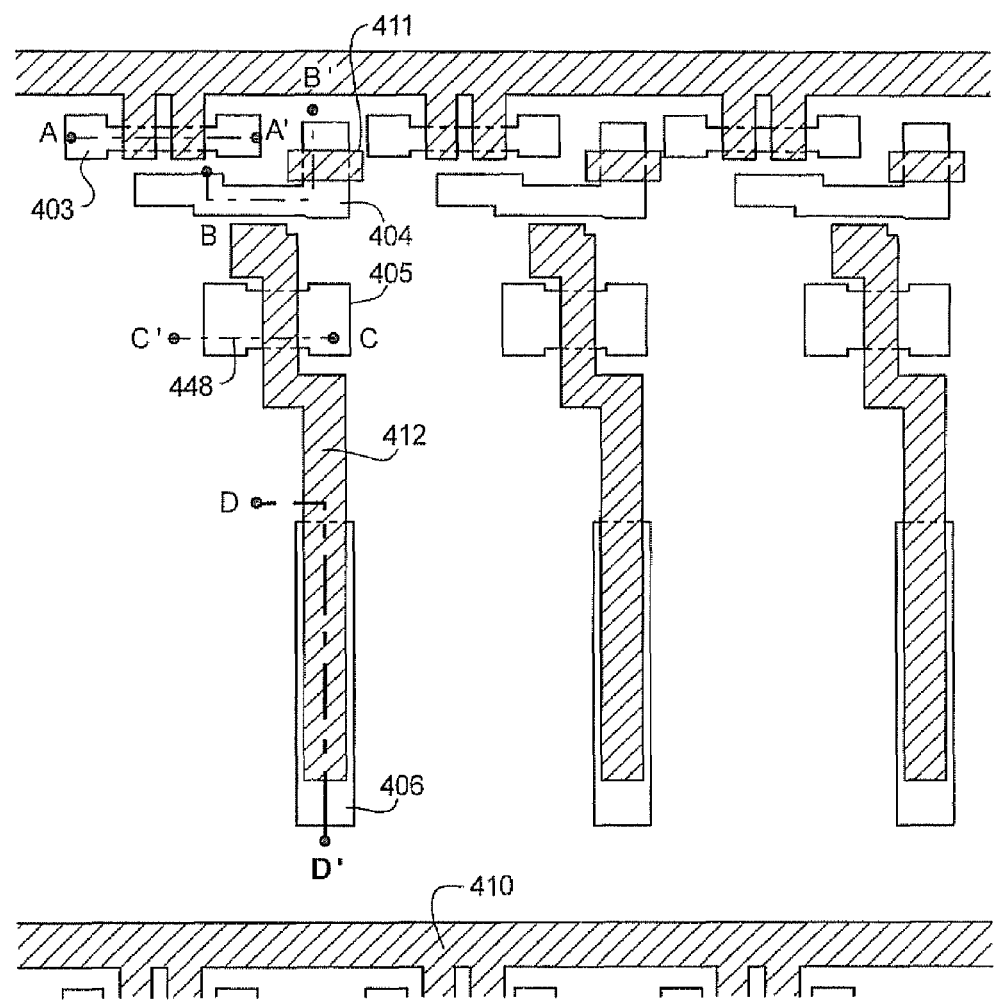
FIG. 11 is a top view of the pixel portion of the organic light emitting display according to Embodiment 1 of the present invention.
Figure 12:
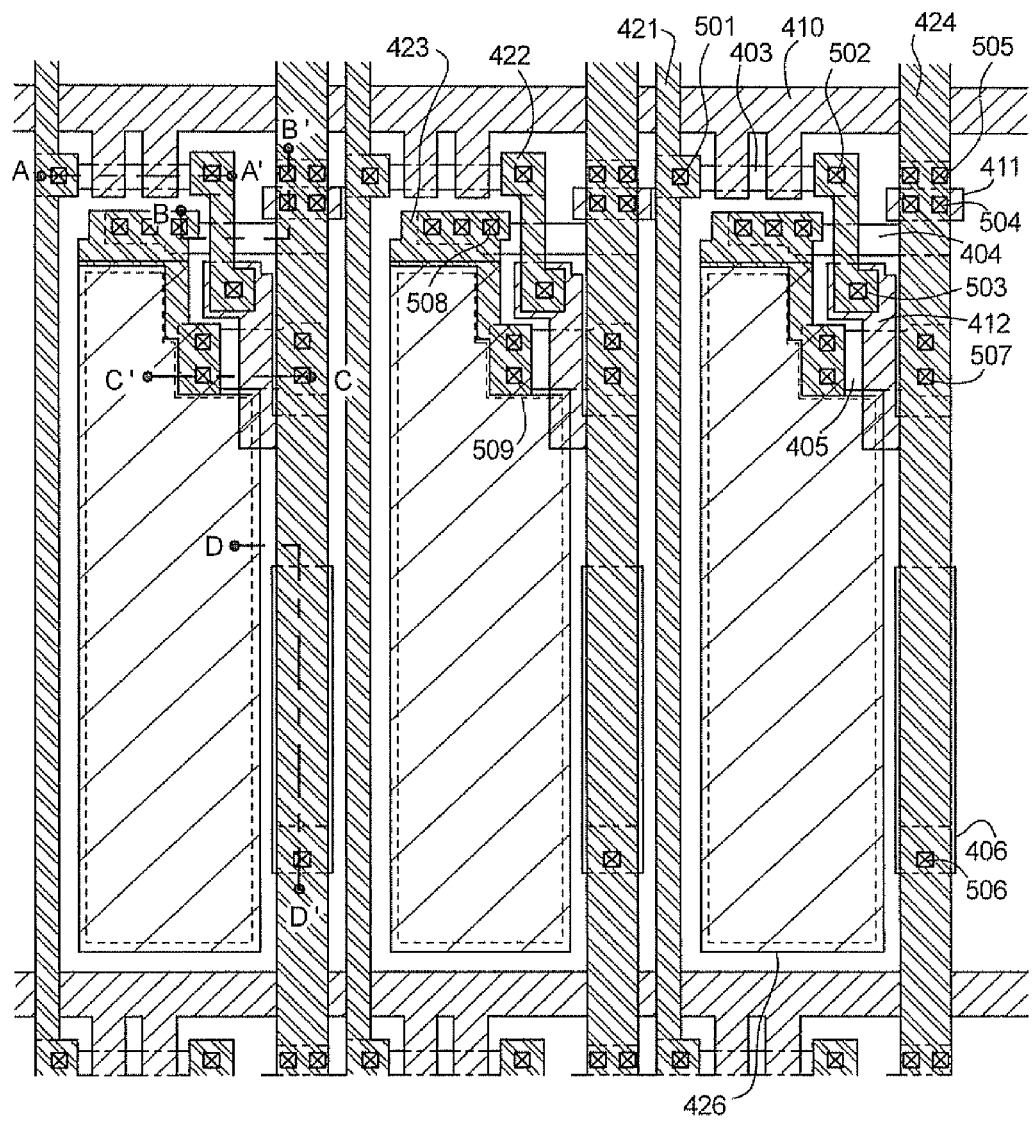
FIG. 12 is a top view of the pixel portion of the organic light emitting display according to Embodiment 1 of the present invention.

FIGS. 11 and 12 are top views of the pixel portion in the thus manufactured organic light emitting display of this embodiment. The structure of the pixel portion of this embodiment will be described with reference to FIGS. 11 and 12.

In FIGS. 11 and 12, components which are common to those in FIG. 10 are denoted by the same reference symbols. Sectional views taken along the dot-dash lines A–A', B–B', C–C', and D–D' of FIGS. 11 and 12 are shown in FIG. 10.

A first semiconductor layer 403, a second semiconductor layer 404, a third semiconductor layer 405, and a fourth semiconductor layer 406 are formed in pixels on a substrate.

A gate insulating film (not shown) is formed on the semiconductor layers. A gate signal line 410 and an island-like gate electrode 411 are arranged in the row direction whereas an island-like capacitor electrode 412 is arranged in the column direction. 410, 411, and 412 are in contact with the gate insulating film.

The gate signal line, the island-like gate electrode, and the capacitor electrode are used as masks to dope the semiconductor layers with an impurity element in a self-aligning manner. As a result, sources and drains are formed in the semiconductor layers.

A first interlayer insulating film is formed from an inorganic material to cover the wiring lines and electrodes. A second interlayer insulating film is formed from an organic material on the first interlayer insulating film and a protective film is formed thereon (FIG. 11). The first and second interlayer insulating films and the protective film are not shown.

Contact holes 501 to 509 are formed. A conductive film is formed into contact with the protective film. The conductive film is patterned to form a source signal line 421, a connection electrode 422, a drain side electrode 423, and a power supply line 424.

The source signal line 421 arranged in the column direction is in contact with the first semiconductor layer 403 through the contact hole 501. The connection electrode 422 is in contact with the first semiconductor layer 403 through the contact hole 502 and is further in contact with the capacitor electrode 412 through the contact hole 503. The power supply line 424 arranged in the column direction is in contact with the island-like gate electrode 411 through the contact hole 504, is further in contact with the second semiconductor layer 404 through the contact hole 505, and is furthermore in contact with the fourth semiconductor layer 406 through the contact hole 506. The drain side electrode 423 is in contact with the second semiconductor layer 404 through the contact hole 508 and is further in contact with the third semiconductor layer 405 through the contact hole 509.

When a selection signal is inputted from a gate signal line 410 that serves as a gate electrode of a switching TFT, the switching TFT inputs a data signal inputted to the source signal line 421 to the connection electrode 422 through a channel formed in the first semiconductor layer.

The data signal inputted from the source signal line through the switching TFT to the connection electrode 422 is inputted to the capacitor electrode 412 that is connected to the connection electrode.

When the data signal is inputted to the capacitor electrode 412 that serves as a gate electrode of a current controlling TFT, a current flows between the power supply line 424 and the drain side electrode 423 in accordance with the level of electric potential of the data signal and the current flows into the organic light emitting element that is connected in series to the current controlling TFT.

In a rectifying TFT, its gate electrode is the island-like gate electrode 411 and is connected to the power supply line 424. A source or drain of the rectifying TFT is also connected to the power supply line 424 and therefore the rectifying TFT has a rectifying characteristic that causes a current to flow readily in the forward direction.

A capacitor has, as its one of electrodes, the fourth semiconductor layer 406 which receives the electric potential of power supply line. The other electrode of the capacitor is the capacitor electrode 412. A capacitance is formed in a region where the capacitor overlaps the capacitor electrode 412 with the gate insulating film (not shown) interposed therebetween.

An ITO film is patterned for each pixel to be into contact with the drain side electrode 423. A pixel electrode (anode) 426 of the organic light emitting element is thus formed. A bank is formed using a photosensitive resin film outside a region surrounded by a dotted line in FIG. 12.

An organic compound layer of the organic light emitting element has a light emitting layer alone. A red light emitting layer, a green light emitting layer, and a blue light emitting layer are respectively formed inside regions surrounded by dotted lines of FIG. 12 to form three types of pixels.

A cathode of the organic light emitting element covers the entire surface of the pixel portion to serve as a common electrode to all pixels, and is electrically connected to the FPC through a wiring line.

An equivalent circuit of such a pixel is shown in FIG. 13. In FIG. 13, components which common to those in FIG. 10 are denoted by the same reference symbols. A switching TFT 434 has a multi-gate structure. A current controlling TFT 436 has an LDD that overlaps a gate electrode. A polysilicon TFT operates at high speed and therefore is weak against degradation such as hot carrier injection. Accordingly, it is very effective in manufacturing a highly reliable display device which is capable of displaying an image with a high quality (high operational performance) to form TFTs with different structures in one pixel so as to suit different functions (a switching TFT which is sufficiently low in OFF current and a current controlling TFT which is strong against hot carrier injection).

[Embodiment 2]

In the present invention, the organic material used as an organic compound layer of an organic light emitting element may be a low molecular weight organic material or a high molecular weight organic material. Major examples of the low molecular weight organic material include $Alq_3$ (tris-8-quinolilite-aluminum) or TPD (triphenylamine derivative). A π-conjugate polymer material can be given as an example of the high molecular weight organic material. Typically, a π-conjugate polymer is PPV (polyphenylene vinylene), PVK (polyvinyl carbazole), or polycarbonate.

A high molecular weight organic material can be formed into a thin film by a simple method such as spin coating, dipping, dispensing, printing, or ink jet, and has higher heat resistance than a low molecular weight organic material.

In an organic light emitting element of an organic light emitting display of the present invention, if an organic compound layer of the organic light emitting element has an electron transporting layer and a hole transporting layer, an amorphous semiconductor layer of an inorganic material may be used for the electron transporting layer and the hole transporting layer. Examples of the inorganic material include amorphous silicon and amorphous $Si_{1-x}C_x$.

An amorphous semiconductor has a large number of trap levels and forms many interface levels at the interface between the amorphous semiconductor and another layer. Therefore, the organic light emitting element can emit light at a low voltage and can have high luminance.

The organic compound layer may be doped with a dopant to change the color of light emitted from the organic light emitting element. Examples of the dopant includes DCM1, Nile red, rubrene, Coumarin 6, TPB, and quinacridon.

[Embodiment 3]

This embodiment describes an example of the exterior of an organic light emitting display according to the present invention. The description is given with reference to FIG. 14. FIG. 14 is a perspective view of the state in which an organic light emitting element formed on an active matrix substrate is sealed and an FPC (flexible printed circuit) is attached. In FIG. 14, components with similar functions to those of FIG. 9 are denoted by the same reference symbols. A region 438a surrounded by a dotted line is a gate signal side driving circuit portion; 438b, a source signal side driving circuit portion, and 439; a pixel portion. 431 denotes a seating substrate. Though not shown in the drawing, a filler may be placed in a gap between the sealing substrate and a substrate 401.

Denoted by 441 is a connection wiring line for transmitting signals to be inputted to the gate signal side driving circuit portion 438a, the source signal side driving circuit portion 438b, and the pixel portion 439. The connection wiring line 441 receives signals from an FPC 442 that serves as a connection terminal to external equipment.

The source signal side driving circuit portion and the gate signal side driving circuit portion are built from a CMOS circuit in which an n-channel TFT and a p-channel TFT are combined complementarily.

Known circuits are employed for the source signal side driving circuit portion and the gate signal side driving circuit portion to suit the driving method of the organic light emitting display, such as time division driving or analog driving.

[Embodiment 4]

A light-emitting device formed by implementing the present invention can be incorporated to various electric-equipment, and a pixel portion is used as an image display portion. Given as such electronic equipment of the present invention are cellular phones, PDAs, electronic books, video cameras, lap-top computers, and image play back devices with the recording medium, for example, DVD (digital versatile disc), digital cameras, and the like. Specific examples of those are shown in FIGS. 15A to 16C.

Figure 15A:
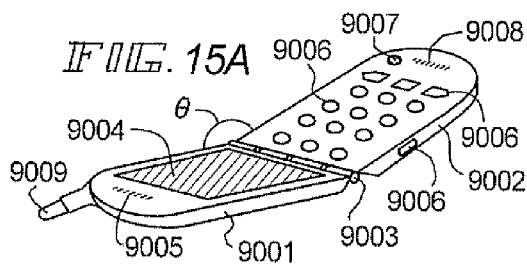
FIGS. 15A to 15D are perspective views showing examples of electronic equipment in accordance with Embodiment 5 of the present invention.

FIG. 15A shows a cellular phone, which is composed of a display panel 9001, an operation panel 9002, and a connecting portion 9003. The display panel 9001 is provided with a display device 9004, an audio output portion 9005, an antenna 9009, etc. The operation panel 9002 is provided with operation keys 9006, a power supply switch 9007, an audio input portion 9008, etc. The present invention is applicable to the display device 9004.

Figure 15B:
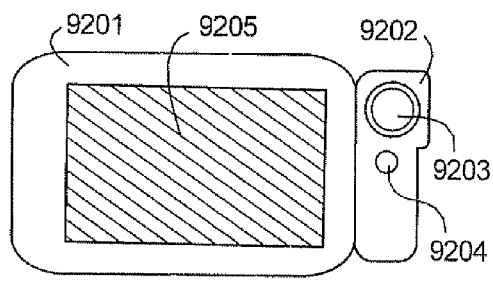

FIG. 15B shows a mobile computer, or a portable information terminal, which is composed of a main body 9201, a camera portion 9202, an image receiving portion 9203, operation switches 9204, and a display device 9205. The present invention can be applied to the display device 9205. In such electronic devices, the display device of 3 to 5 inches is employed, however, by employing the display device of the present invention, the reduction of the weight in the portable information terminal can be attained.

Figure 15C:
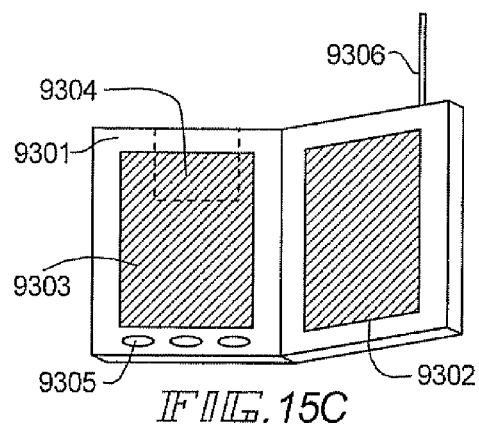

FIG. 15C shows a portable book, which is composed of a main body 9301, display devices 9302 to 9303, and a recording medium 9304, an operation switch 9305, and an antenna 9306, and which displays the data recorded in MD or DVD and the data received by the antenna. The present invention can be applied to the display devices 9302 to 9303. In the portable book, the display device of the 4 to 12 inches is employed. However, by employing the display device of the present invention, the reduction of the weight and thickness in the portable book can be attained.

Figure 15D:
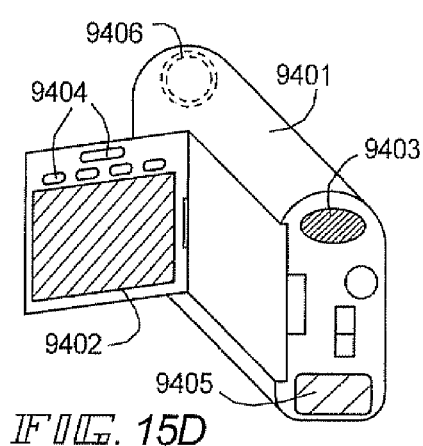

FIG. 15D shows a video camera, which is composed of a main body 9401, a display device 9402, an audio input portion 9403, operation switches 9404, a battery 9405, an image receiving portion 9406, and the like. The present invention can be applied to the display device 9402.

Figure 16A:
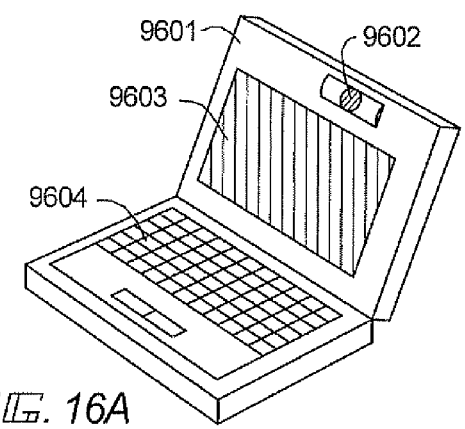
FIGS. 16A to 16C are perspective views showing examples of electronic equipment in accordance with Embodiment 5 of the present invention.

FIG. 16A shows a personal computer, which is composed of a main body 9601, an image input portion 9602, a display device 9603, and a key board 9604. The present invention can be applied to the display device 9603.

Figure 16B:
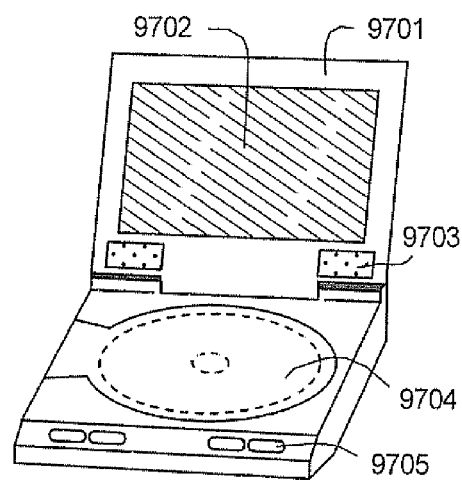

FIG. 16B shows a player employing a recording medium with programs recorded thereon (hereinafter referred to as recording medium), which is composed of a main body 9701, a display device 9702, a speaker portion 9703, a recording medium 9704, and an operation switch 9705. The device employs DVD (digital versatile disc), CD, etc. as the recording medium so that music can be listened, movies can be seen and games and Internet can be done. The present invention can be applied to the display device 9702.

Figure 16C:
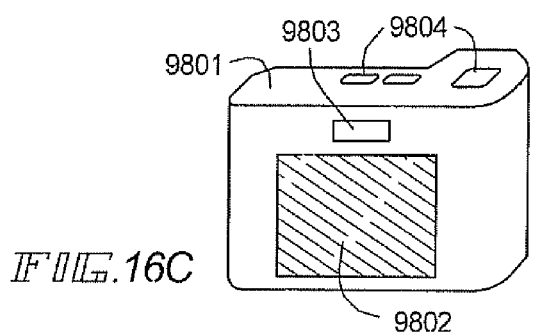
Figure 17:
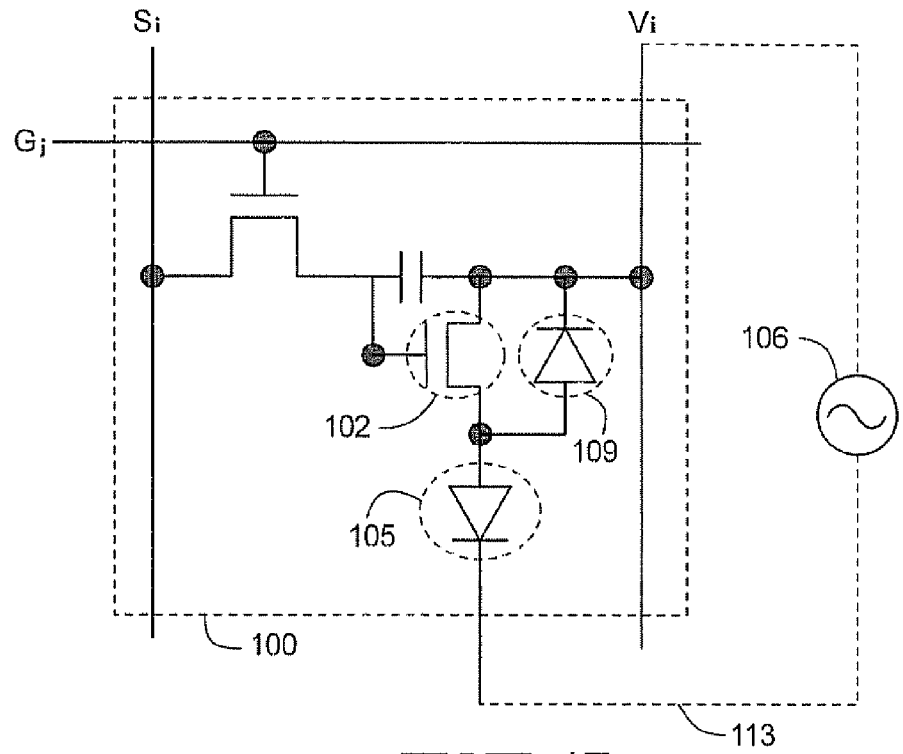
FIG. 17 is an example of circuit diagram of a pixel in an organic light emitting display of the present invention.
Figure 18A:
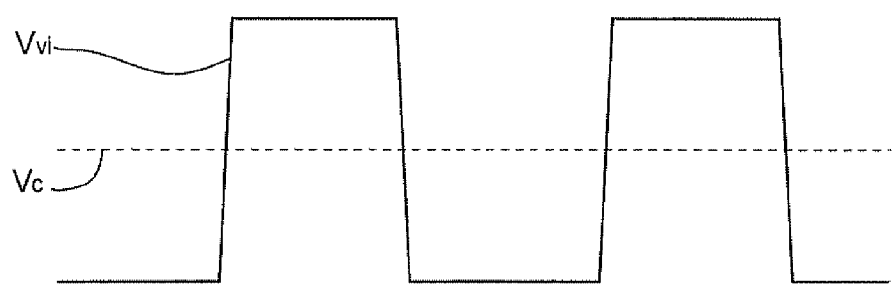
FIG. 18 is an example of waveform chart showing an alternating current driving method of the present invention.
Figure 18B:
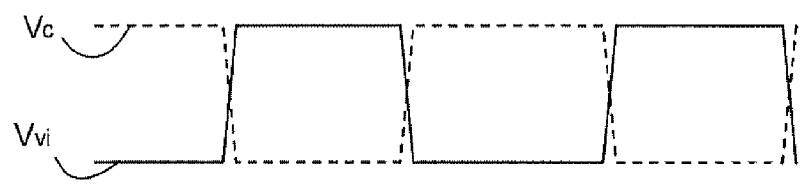
Figure 19:
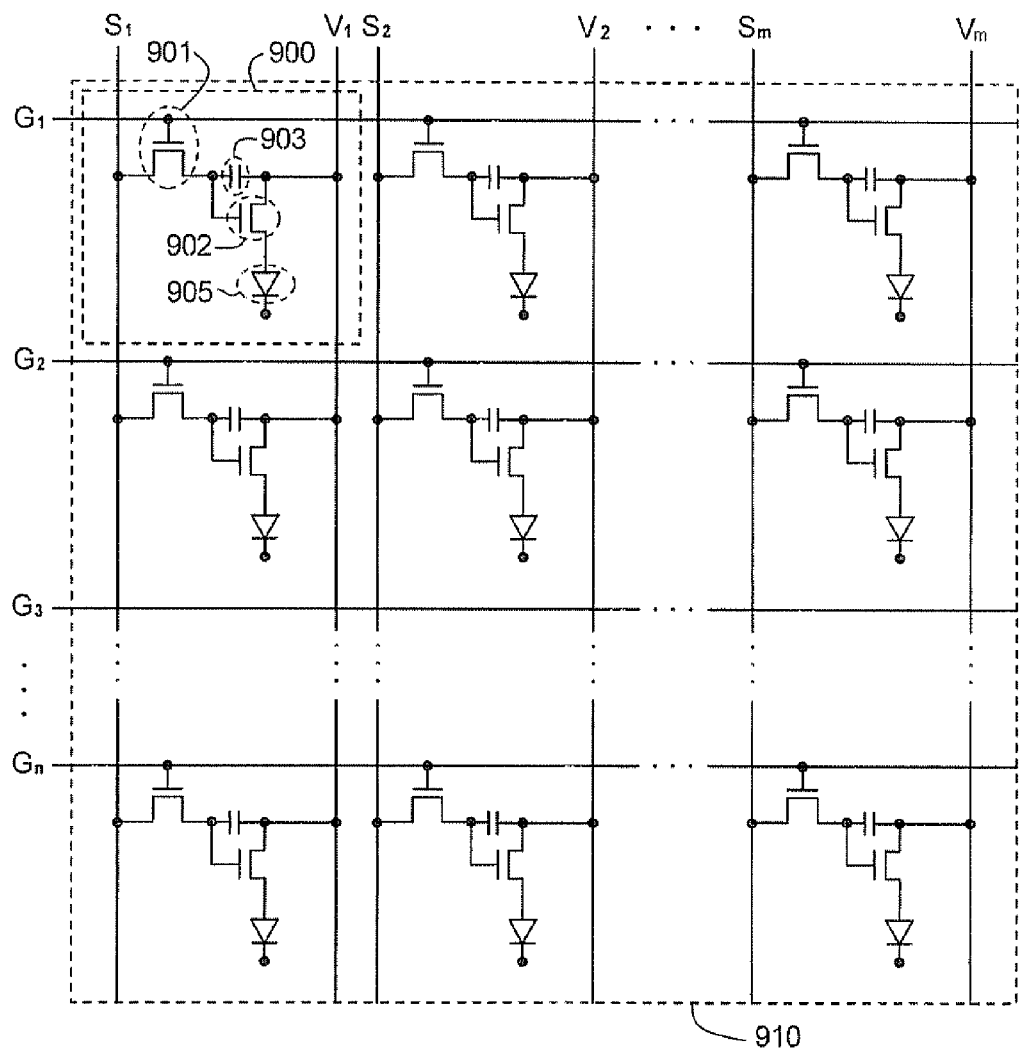
FIG. 19 is an example of circuit diagram of a pixel in a conventional organic light emitting display.

FIG. 16C shows a digital camera, which is composed of a main body 9801, a display device 9802, an eyepiece portion 9803, an operation switch 9804, and an image receiving portion (not shown). The present invention can be applied to the display device 9802.

The display device of the present invention is employed in the cellular phones in FIG. 15A, the mobile computer or the portable information terminal in FIG. 15B, the portable book in FIG. 15C, and the personal computer in FIG. 16A. The display device can reduce the power consumption of the above device by displaying white letters on the black display in a standby mode.

In the operation of the cellular phones shown in FIG. 10A, luminance is lowered when the operation keys are used, and the luminance is raised after usage of the operation switch, whereby the low power consumption can be realized. Further, the luminance of the display device is raised at the receipt of a call, and the luminance is lowered during a call, whereby the low power consumption can be realized. Besides, in the case where the cellular phone is continuously used, the cellular phone is provided with a function of turning off a display by time control without resetting, whereby the low power consumption can be realized. Note that the above operations may be conducted by manual control.

Although it is not shown here, the present invention can be applied to the display device which is employed in a navigation system, a refrigerator, a washing machine, a micro-wave oven, a telephone, a fax machine, etc. As described above, the applicable range of the present invention is so wide that the present invention can be applied to various products.

In a pixel of an organic light emitting display of the present invention, reverse bias can readily be applied to an organic light emitting element by using a rectifying element. As a result, lowering of luminance in an organic light emitting element, which is a problem in direct current driving, can be prevented and quality of display is ensured.

If the electric potential of an opposite electrode of an organic light emitting element and the electric potential of a power supply line are both changed in driving the organic light emitting element with alternating current, an alternating current source that outputs an alternating current waveform can be driven at low voltage, the long-term operation of the alternating current source is stabilized, and the alternating current source can cost lower.

What is claimed is:

1. A display device comprising a plurality of pixels each comprising a transistor, a light emitting element comprising an organic compound, and a rectifying element,
   wherein one of a source and a drain of the transistor is connected to a pixel electrode of the organic light emitting element and the other one of the source and the drain of the transistor is connected to a first terminal of an alternating current source and the rectifying element,
   wherein the rectifying element is connected to the first terminal of the alternating current source and to the pixel electrode of the light emitting element, and
   wherein an opposite electrode of the organic light emitting element is connected to a second terminal of the alternating current source.

2. A display device according to claim 1, wherein the transistor is a thin film transistor.

3. A display device according to claim 1, wherein the plurality of pixels are integrated with a driving circuit for driving the pixels on a glass substrate.

4. A display device according to claim 1, wherein said display device is one selected from the group consisting of a cellular phone, a computer, a video camera, and a digital camera.

5. A method of driving a display device according to claim 1, wherein a forward direction of the rectifying element and a reverse bias of the light emitting element have the same direction.

6. A display device comprising a plurality of pixels each comprising a switching transistor, a current controlling transistor, a rectifying transistor, and a light emitting element comprising an organic compound,
   wherein a gate of the switching transistor is connected to a gate signal line,
   wherein one of a source and a drain of the switching transistor is connected to a source signal line and the other one of the source and the drain of the switching transistor is connected to a gate of the current controlling transistor,
   wherein one of a source and a drain of the current controlling transistor is connected to an alternating current source and the other one of the source and the drain of the current controlling transistor is connected to a pixel electrode of the light emitting element,
   wherein a gate of the rectifying transistor is connected to the alternating current source,
   wherein one of a source and a drain of the rectifying transistor is connected to the alternating current source and the other one of the source and the drain of the rectifying transistor is connected to the pixel electrode of the light emitting element.

7. A display device according to claim 6,
   wherein the pixel electrode of the organic light emitting element is an anode and the opposite electrode thereof is a cathode, and
   wherein the current controlling transistor and the rectifying transistor have a p type conductivity.

8. A display device according to claim 6,
   wherein the pixel electrode of the light emitting element is a cathode and the opposite electrode thereof is an anode, and
   wherein the current controlling transistor and the rectifying transistor have an n type conductivity.

9. A display device according to claim 6, wherein the switching transistor, the current controlling transistor, and the rectifying transistor are thin film transistors.

10. A display device according to claim 6, wherein the plurality of pixels are integrated with a driving circuit for driving the pixels on a glass substrate.

11. A display device according to claim 6, wherein said display device is one selected from the group consisting of a cellular phone, a computer, a video camera, and a digital camera.

12. A method of driving a display device according to claim 6, wherein a forward direction of the rectifying element and a reverse bias of the light emitting element have the same direction.

13. A method of driving a display device comprising a plurality of pixels each comprising a transistor, a rectifying element, and a light emitting element comprising an organic compound,
   wherein one of a source and a drain of the transistor is connected to a first terminal of an alternating current source and the other one of the source and the drain of the transistor is connected to a pixel electrode of the light emitting element and the rectifying element,
   wherein the rectifying element is connected to the first terminal of the alternating current source and to the pixel electrode of the light emitting element,
   wherein an opposite electrode of the light emitting element is connected to a second terminal of the alternating current source,
   wherein reverse bias is applied to the light emitting element when voltage is applied by the alternating current source in a forward direction of the rectifying element, and
   wherein forward bias is applied to the light emitting element when voltage is applied by the alternating current source in a reverse direction of the rectifying element.

14. A method of driving a display device according to claim 13,
   wherein an address period, in which a data signal is inputted to the light emitting element, and a sustain period, in which the light emitting element emits or does not emit light in accordance with the inputted data signal, are provided, and
   wherein a polarity of voltage outputted from the alternating current source is changed when the address period is ended to start the sustain period.

15. A method of driving a display device according to claim 11, wherein a waiting period, in which voltage with the same polarity as the voltage in the address period is outputted from the alternating current source, is interposed between the address period and the sustain period.

16. A method of driving a display device according to claim 13, wherein a plurality of address periods and a plurality of sustain periods with different lengths form one frame period for performing time division of a gray scale display.

17. A method of driving a display device according to claim 13, wherein the electric potential of the pixel electrode of the light emitting element and the electric potential of the opposite electrode are changed simultaneously when the reverse bias or forward bias is applied to the light emitting element by the alternating current source.

18. A method of driving a display device comprising a plurality of pixels each comprising a switching transistor, a current controlling transistor, a rectifying transistor, and a light emitting element comprising an organic compound,
   wherein a gate of the switching transistor is connected to a gate signal line, wherein one of a source and a drain of the switching transistor is connected to a source signal line and the other one of the source and the drain of the switching transistor is connected to a gate of the current controlling transistor, wherein one of a source and a drain of the current controlling transistor is connected to a first terminal of an alternating current source and the other one of the source and the drain of the current controlling transistor is connected to a pixel electrode of the light emitting element, wherein a gate of the rectifying transistor is connected to the first terminal of alternating current source, wherein one of a source and a drain of the rectifying transistor is connected to the first terminal of the alternating current source and the other one of the source and the drain of the rectifying transistor is connected to the pixel electrode of the light emitting element, wherein an opposite electrode of the light emitting element is connected to a second terminal of the alternating current source, wherein reverse bias is applied to the light emitting element when voltage is applied by the alternating current source in a forward direction of the rectifying transistor, and wherein forward bias is applied to the light emitting element when voltage is applied by the alternating current source in a reverse direction of the rectifying transistor.

19. A method of driving a display device according to claim 18, wherein an address period, in which a data signal is inputted to the light emitting element, and a sustain period, in which the Light emitting element emits or does not emit light in accordance with the inputted data signal, are provided, and wherein a polarity of voltage outputted from the alternating current source is changed when the address period is ended to start the sustain period.

20. A method of driving a display device according to claim 19, wherein a waiting period, in which voltage with the same polarity as the voltage in the address period is outputted from the alternating current source, is interposed between the address period and the sustain period.

21. A method of driving a display device according to claim 18, wherein a plurality of address periods and a plurality of sustain periods with different lengths form one frame period for performing time division of a gray scale display.

22. A method of driving a display device according to claim 18, wherein the electric potential of the pixel electrode of the light emitting element and the electric potential of the opposite electrode are changed simultaneously when the reverse bias or forward bias is applied to the light emitting element by the alternating current source.

* * * * *